US010122365B2

(12) United States Patent
Pascall et al.

(10) Patent No.: US 10,122,365 B2
(45) Date of Patent: Nov. 6, 2018

(54) SYSTEM AND METHOD FOR FLEXURE BASED MICROSTRUCTURAL LOGIC GATES

(71) Applicant: Lawrence Livermore National Security, LLC, Livermore, CA (US)

(72) Inventors: Andrew J. Pascall, Livermore, CA (US); Robert Matthew Panas, Dublin, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days.

(21) Appl. No.: 15/445,038

(22) Filed: Feb. 28, 2017

(65) Prior Publication Data

US 2018/0248552 A1     Aug. 30, 2018

(51) Int. Cl.
*H03K 19/20* (2006.01)
(52) U.S. Cl.
CPC .................... *H03K 19/20* (2013.01)
(58) Field of Classification Search
CPC .................................................. H03K 19/20
USPC ................................................. 326/38, 104
See application file for complete search history.

(56) References Cited

U.S. PATENT DOCUMENTS

2017/0192748 A1*   7/2017   Merkle .................... G06F 5/01

FOREIGN PATENT DOCUMENTS

WO     WO2017074925      *   5/2017   ............ H03K 19/00

OTHER PUBLICATIONS

Raney, et al., "Stable propagation of mechanical signals in soft media using stored elastic energy", www.pnas.org/cgi/doi/10.1073/pnas.1604838113, 6 pgs.
Raney et al., "Supporting Information", www.pnas,org/cni/content/short/1604838113, 9 pgs.

* cited by examiner

*Primary Examiner* — Don Le
(74) *Attorney, Agent, or Firm* — Harness, Dickey & Pierce, P.L.C.

(57) ABSTRACT

A resettable mechanical logic circuit is disclosed which is formed as part of a material structure. The circuit makes use of a bistable element. The bistable element may have a characteristic of being stable in either one of first and second orientations, once moved past a midpoint between the first and second orientations.

21 Claims, 27 Drawing Sheets

Flexure beam with distributed compliance

Flexure beam with localized compliance

Since gate = 0, output node can be either 0 or 1, this is in the memory storage mode

SYSTEM AND METHOD FOR FLEXURE BASED MICROSTRUCTURAL LOGIC GATES

STATEMENT OF GOVERNMENT RIGHTS

The United States Government has rights in this invention pursuant to Contract No. DE-AC52-07NA27344 between the U.S. Department of Energy and Lawrence Livermore National Security, LLC, for the operation of Lawrence Livermore National Laboratory.

FIELD

The present disclosure relates to mechanical logic circuits, and more particularly to resettable mechanical logic gates that are integrated into the microstructure of a material during manufacture of the material.

BACKGROUND

This section provides background information related to the present disclosure which is not necessarily prior art.

The first developed computers were based on mechanical logic. In the mid-1800s, Charles Babbage and Ada Lovelace designed the first programmable, Turing-complete computer, the "analytical engine", based on mechanical logic. A significant challenge with mechanical logic, however, has been the inability to successfully scale down mechanical logic systems to microscale dimensions. While the computing industry quickly moved to electronic logic systems, mechanical logic still offers several advantages. Chief among them, mechanical logic circuits do not require an electrical power source. As a result, computers built using mechanical logic circuit will have a negligible electromagnetic (EM) signature.

Previously developed microscale material logic gates are known as "single use" logic gates. By "single use" logic gates it is meant that the logic gates are useable one time only; they do not allow for the logic circuit to be reset to enable further computation. This significantly limits the applications that such logic gates may be used in. A mechanical logic gate that could be "reset" and used repeatedly would significantly expand the number of potential applications that mechanical logic gates could be used in. For example, multi-use mechanical logic elements could be used to act as simple status sensors for a material, changing an output RF signature (via RFID type technology) based on material stress, temperature, magnetic field, crack propagation or other parameter. This could be combined via the mechanical logic to only change signature upon the receipt of a special sequence of signals. This would act as a micro-scale lock and key system, which could be used to ensure that smart tags on credit cards, passports or other secure devices only respond when desired, for instance, when pressed on. Multi-use low power mechanical circuitry could also be used to effectively provide a means of surveillance. For instance, a micro-scale grain-of-salt sized radiologically activated circuit could trigger given the absorption of a particular kind of radiation, mechanically switching an RFID loop to change to response pulse. Now, when pulsed, the sensors which have observed the radiation will return an adjusted frequency. A simple hand-held RFID reader could pulse an area and get an exact reading of where the radiological source has been. Resettable circuits allow for real time position location, as when the source moves on by, the mechanical logic turns itself back off. With the resettable microscale logic gates, RF pulses would only return sensors readings next to the present location of the source, providing a real-time read-out of source location. This could similarly be done for tracking other signals, including temperature, chemicals, or mechanical load. For example, hydrogen sensitive circuits could be seeded around a hydrogen processing facility, even mixed into the paint. A quick scan with an RF reader would immediately determine the status and location of any gas leaks. Such sensors could be deployed by a method akin to crop dusting over a gas leak to monitor the gas plume location (if invisible) in real-time. The mechanical logic provides a means to transfer from one sensing domain, located in microscale structures and possibly widely distributed over the environment, to another domain. This second domain could well be radiation (RF), so that the scanning and information retrieval could be done at remotely. More complex information capture mechanisms, such as audio or other signal recording are also possible with more extensive mechanical logic. These records could be transmitted back to the RF source upon radio interrogation. This would provide an easy means to check for intrusion or tampering in a device, even if the device is later reset.

The present invention could be applied to low power sensing applications, environmental monitoring and logging of temperature or humidity cycling. Due to the small size of the logic gates and no electrical consumption, they can be easily concealed within the structure of a material and perform computing operations clandestinely. For example, monitoring diurnal temperature variations at a location. Furthermore, microscale mechanical logic gates could form the basis of materials that sense and respond to their environment, or so-called sentient materials. For example, in oil, gas, and geothermal wells, rock formation temperature and pressure are important metrics for operation. Microscale mechanical logic circuits could be built into small particles, creating "smart dust", that could be injected into the well. The smart dust could be programmed to trigger release of a chemical that can be sensed at an extraction well when certain thresholds in pressure and temperature are simultaneously crossed, thus providing critical information that is difficult to determine by other means.

SUMMARY

This section provides a general summary of the disclosure, and is not a comprehensive disclosure of its full scope or all of its features.

In one aspect the present disclosure provides a resettable mechanical logic circuit formed as part of a material structure. The circuit may comprise a bistable element formed as a length of material and supported at least at one end thereof. The bistable element may have a characteristic of being stable in either one first and second orientations, once moved past a midpoint.

In another aspect the present disclose relates to a resettable mechanical logic circuit formed as part of a material structure. The circuit may comprise a pair of bistable input node elements each formed as a length of material having a non-linear stiffness, and each being supported at opposite ends thereof. Each bistable input node element may have first and second orientations of low stress separated by a midpoint of high stress, and each may be movable by an input signal applied to a center area of its length toward the midpoint of high stress. A bistable output node element may be formed as a length of material having a non-linear stiffness and supported at opposite ends thereof, and may have first and second orientations of low stress separated by a midpoint of high stress. The bistable output node element may be movable by an input signal applied to a center area of its length toward the midpoint of high stress. Each of the bistable input node elements and the bistable output node element may have a characteristic of being stable in either of its first and second orientations of low stress, once moved past the midpoint of high stress. A slide limiter structure may be interposed between the pair of input node elements and the output node element. The slide limiter structure may include a beam and may be operatively coupled to the center areas of each of the bistable input node elements at outer ends of the beam. The beam may be movable pivotally about a midpoint thereof. A lever arm beam may be operatively coupled to a midpoint of the slide limiter structure, and at one distal end of the lever arm beam may be operatively to the center area of the output node element. Movement of either one of the input node elements from its logic 0 state to its logic 1 state causes movement of the output node element from its logic 0 state to its logic 1 state.

In another aspect the present disclosure relates to a resettable mechanical logic AND circuit formed as part of a material structure. The circuit may comprise a pair of bistable input node elements each formed as a length of material having a non-linear stiffness and supported at opposite ends thereof. Each bistable input node element may have first and second orientations of low stress separated by a midpoint of high stress, and each may be movable by an input signal applied to a center area of its length toward the midpoint of high stress. A bistable output node element may be included which may be formed as a length of material having a non-linear stiffness and supported at opposite ends thereof, and may have first and second orientations of low stress separated by a midpoint of high stress. The bistable output node element may be movable by an input signal applied to a center area of its length toward the midpoint of high strength. Each of the bistable input node elements and the bistable output node element may have a characteristic of being stable in either of its first and second orientations of low stress, once moved past the midpoint of high stress. A slide limiter structure may be included which is interposed between the pair of bistable input node elements and the bistable output node element. The slide limiter structure may include a beam, and the center areas of each of the bistable input node elements may be coupled to outer ends of the beam. The beam may be movable pivotally about a midpoint thereof as well as translatable in a linear direction. A lever arm beam may be included which is operatively coupled to a midpoint of the slide limiter structure, and at one distal end operatively to the center area of the bistable output node element. Movement of only one of the bistable input node elements from its logic 0 state to its logic 1 state, while the other one of the bistable input node elements is in its logic 0 state, is not sufficient for the slide limiter structure to cause movement of the bistable output node element from its logic 0 state to its logic 1 state.

In still another aspect the present disclosure relates to a resettable mechanical logic signal wire circuit formed as part of a material structure. The circuit may comprise first and second bistable elements each formed as a length of material having a non-linear stiffness and supported at opposite ends thereof. Each bistable element may have first and second orientations of low stress separated by a midpoint of high stress, and each may be movable by an input signal applied to a center area of its length toward the midpoint of high stress. Each bistable element may have a characteristic of being stable in either of its first and second orientations of low stress, once moved past the midpoint of high stress. The first and second bistable elements may be arranged adjacent to one another and intercoupled by a biasing element at their center areas. Movement of the first bistable element from a logic 0 state to a logic 1 state causes movement of the biasing element, which in turn causes the second bistable element to move from its logic 0 state to its logic 1 state.

In still another aspect the present disclosure relates to a resettable mechanical amplifier circuit formed as part of a material structure. The circuit may comprise first and second bistable elements forming bistable input and output node elements, respectively. Each one of the bistable input and output node elements may be formed as a length of material having a non-linear stiffness and supported at opposite ends thereof. Each bistable input and output node element may also have first and second orientations of low stress separated by a midpoint of high stress, with each being movable by an input signal applied to a center area of its length toward the midpoint of high stress. Each bistable input and output node element may have a characteristic of being stable in either of its first and second orientations of low stress, once moved past the midpoint of high stress. The first and second bistable node elements may be arranged adjacent to one another and intercoupled by an actuation shuttle. The actuation shuttle may be supported by a plurality of lengths of material each including at least one energy responsive film. A power source may be operably associated with the bistable input node element and the actuation shuttle. A pivotally supported beam may be operatively coupled to the actuation shuttle and movable in accordance with linear movement of the actuation shuttle. The beam may further be operatively coupled to the bistable output node element. Movement of the bistable input node element from its logic 0 state to its logic 1 state, along with electric power delivered to the energy responsive film and pivoting movement of the beam, controls a state of the bistable output node element.

In still another aspect the present disclosure relates to a method for forming a resettable mechanical logic circuit as part of a material structure. The method may comprise forming a bistable element as a length of material supported at least at one end thereof. The method may also comprise further forming the bistable element so that the bistable element is movable between first and second orientations, separated by a midpoint. The bistable element further may be movable by an input signal applied to a center area of its length toward the midpoint. The method may also involve further forming the bistable element such that the bistable element is stable in either of its first and second orientations, once moved past the midpoint. The method may further involve using one orientation of the bistable element to indicate a logic 1 state and the other orientation of the bistable element to indicate a logic 0 state.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 6:
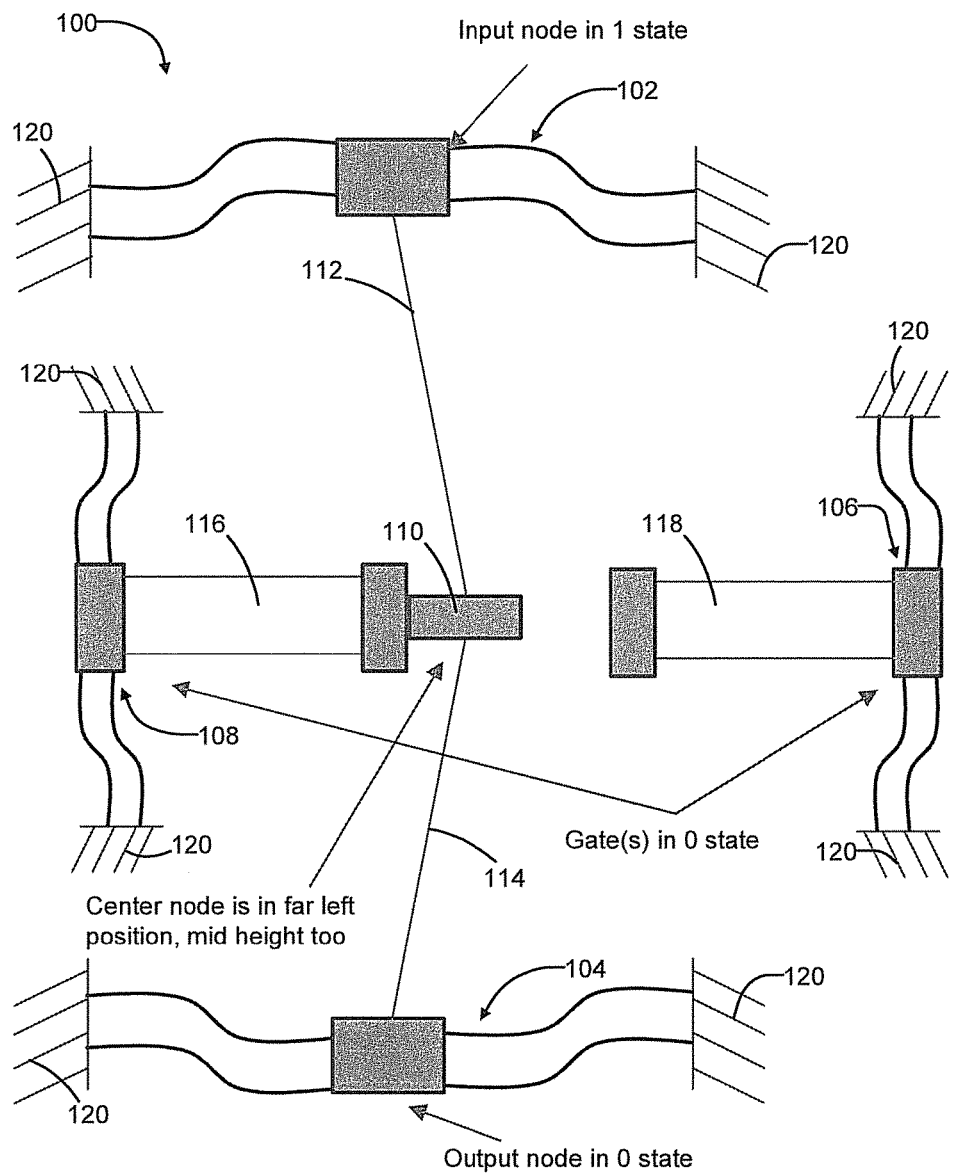
FIG. 6 shows a static random access memory (SRAM) cell formed using a plurality of the bistable flexures of FIG. 1, with two of the flexures forming a gate.
Figure 10:
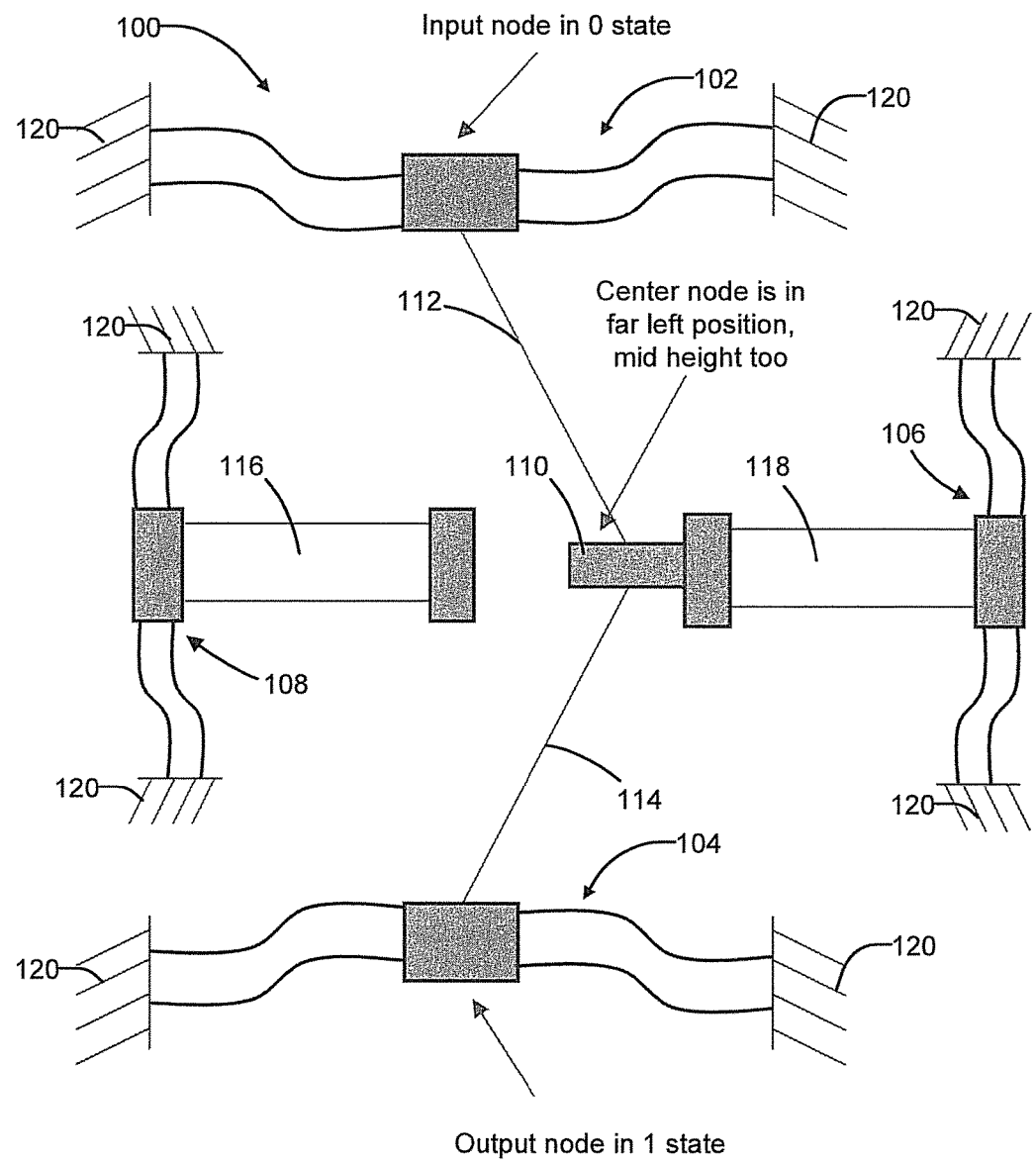
Figure 11:
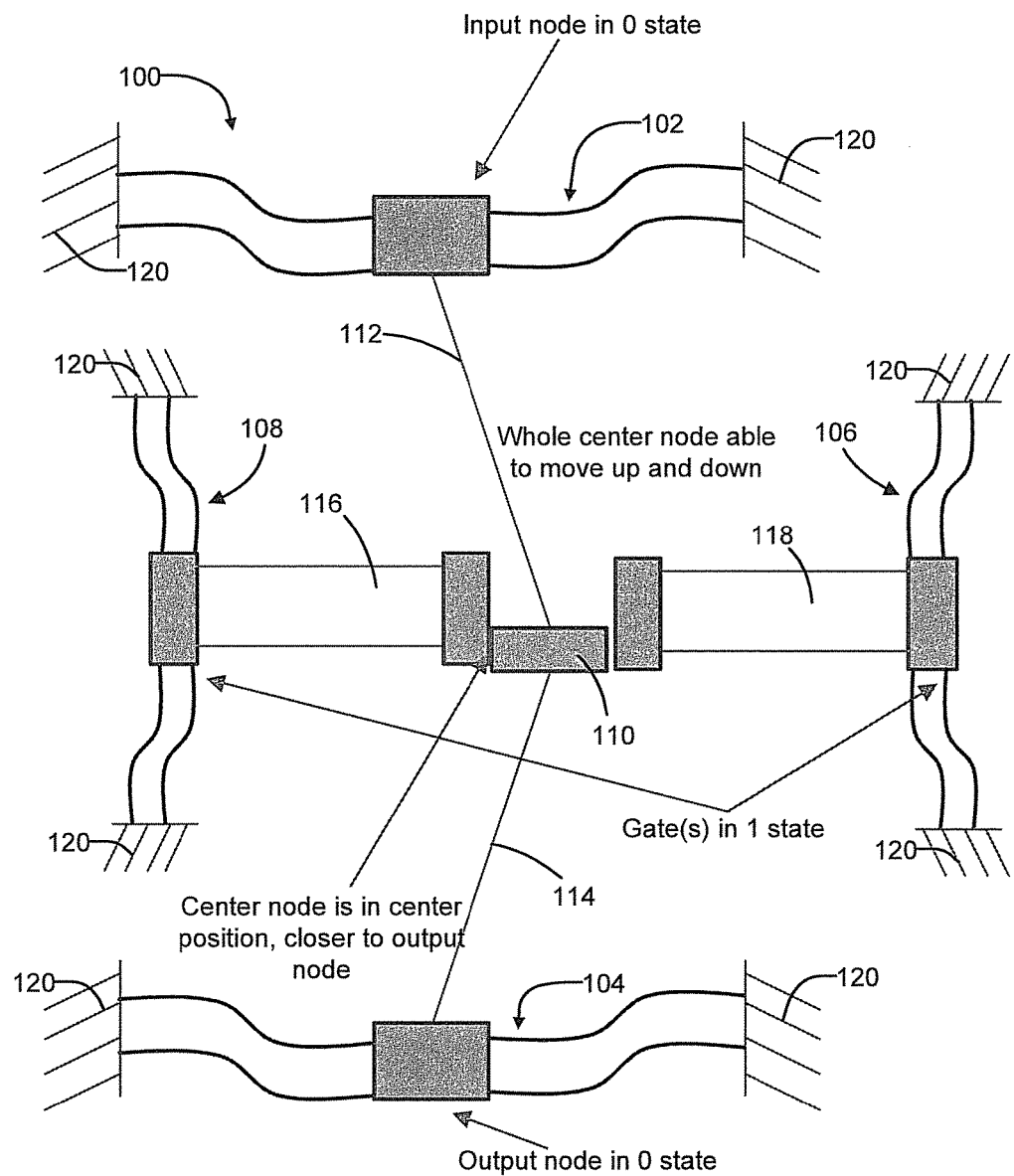
Figure 12:
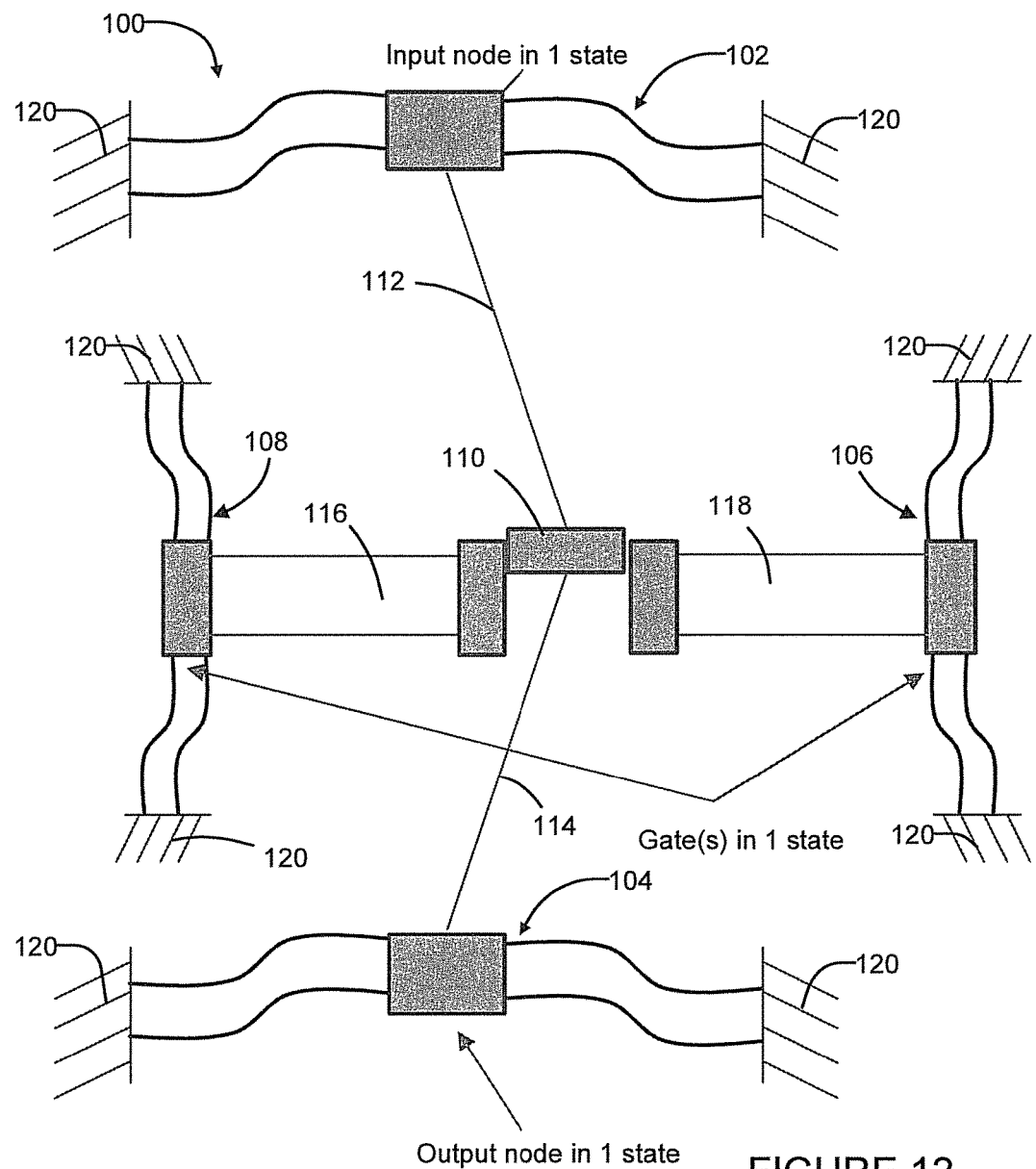
Figure 13:
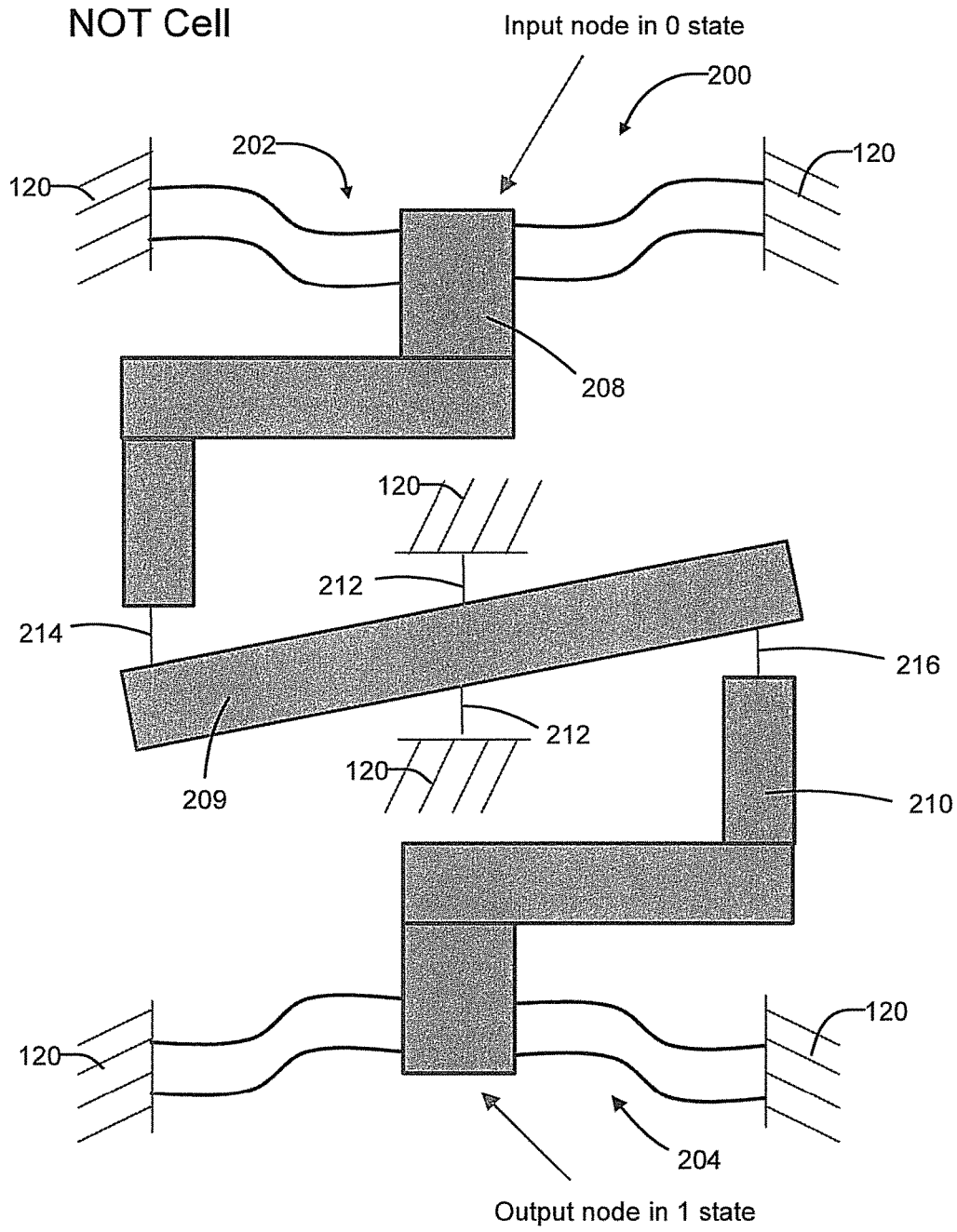
Figure 14:
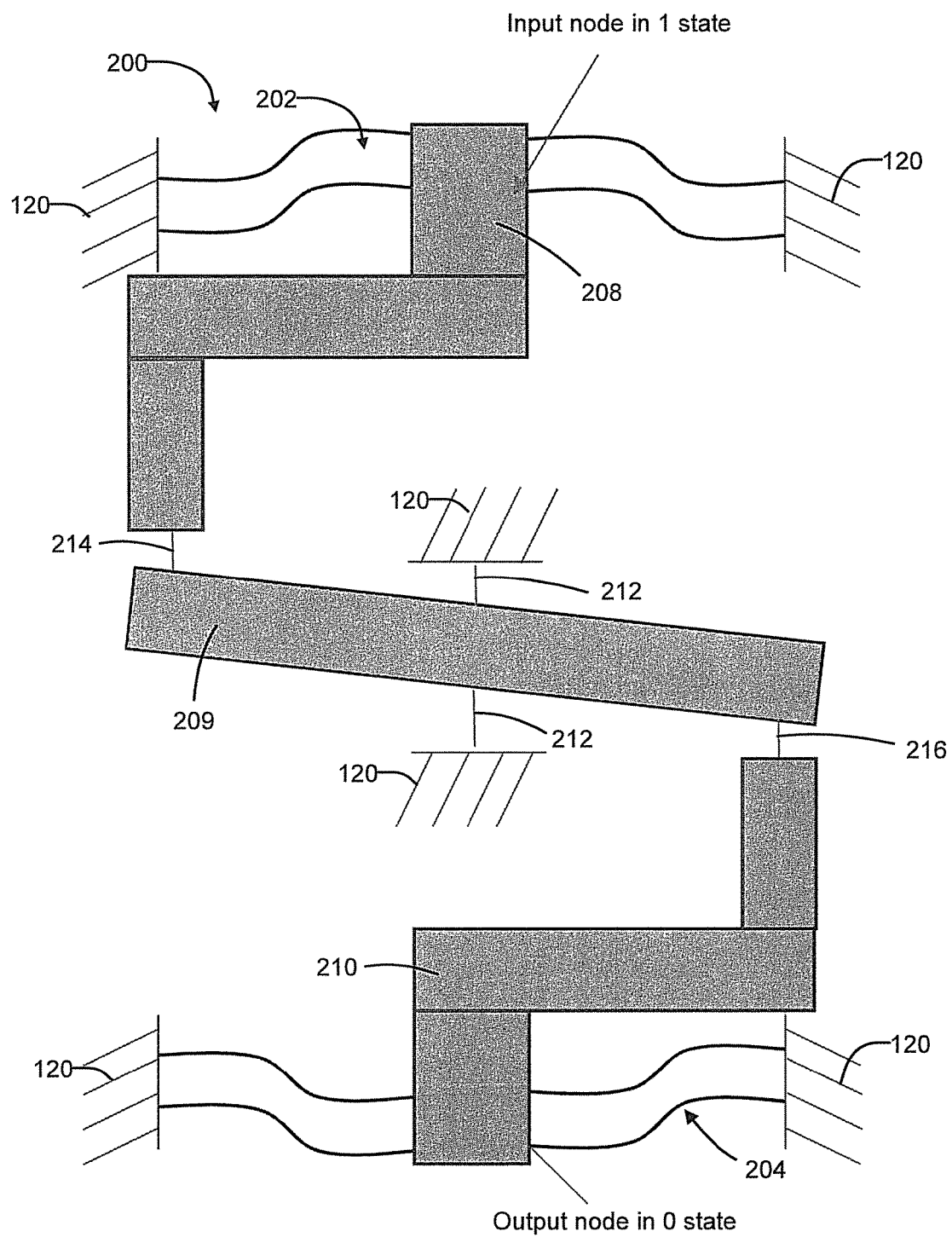
Figure 15:
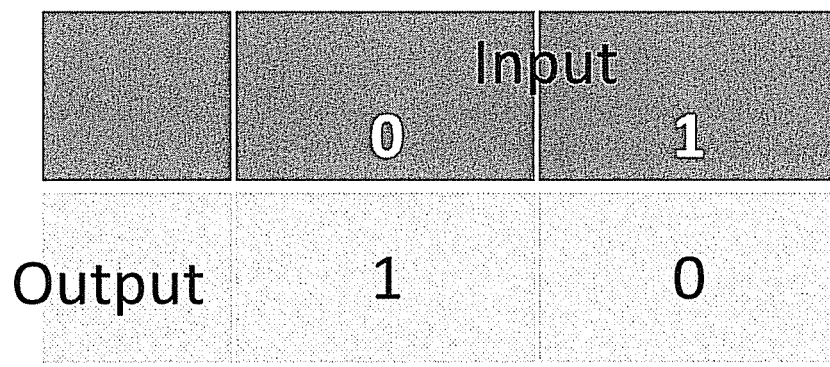
Figure 16:
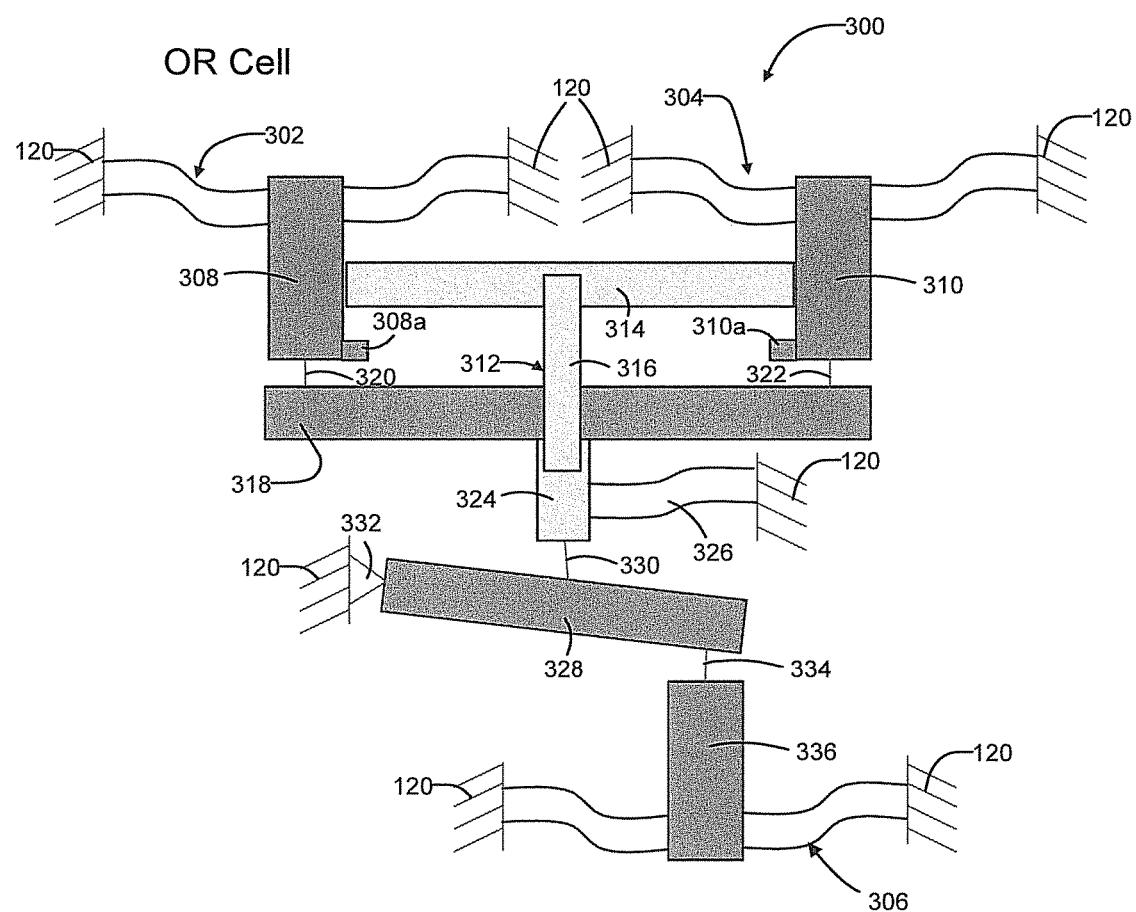
Figure 17:
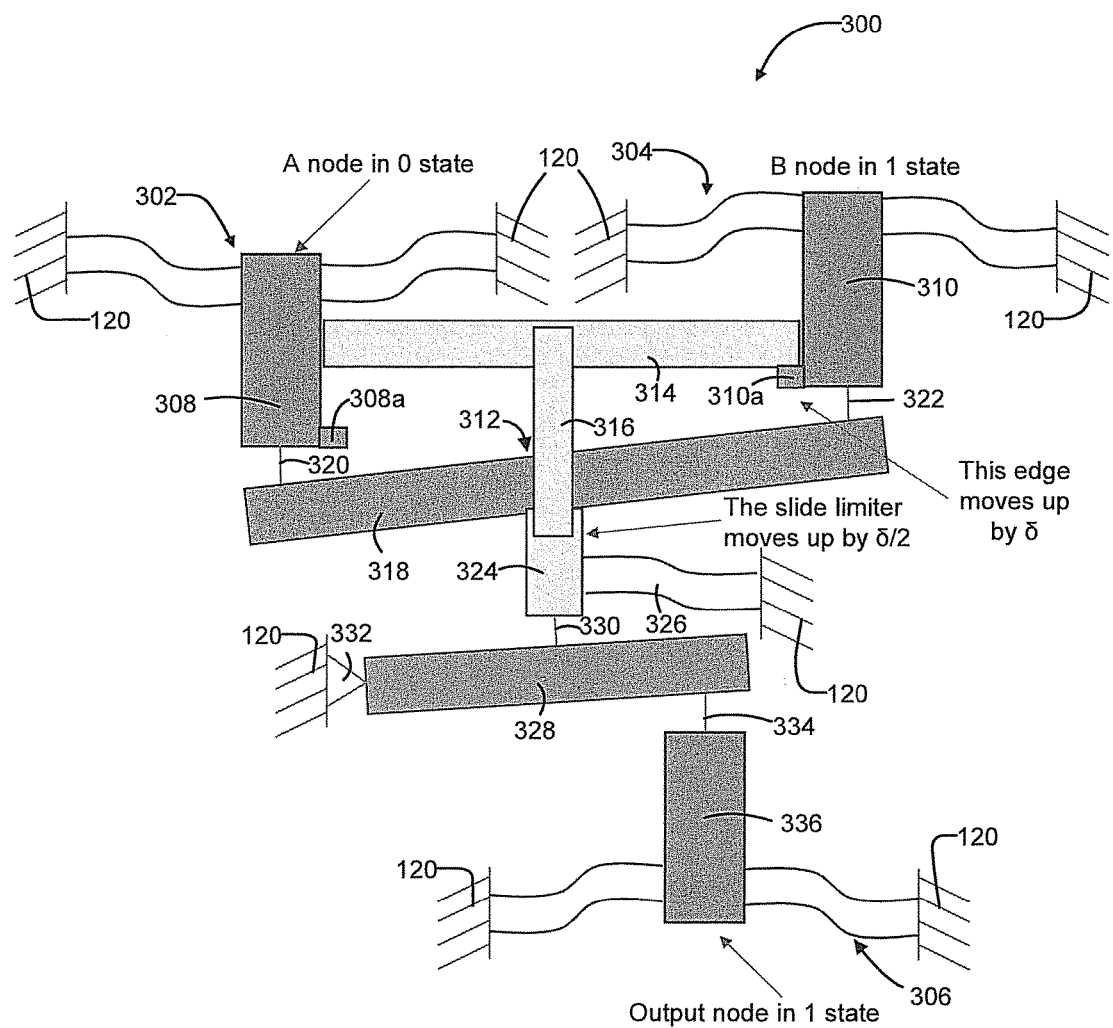
Figure 18:
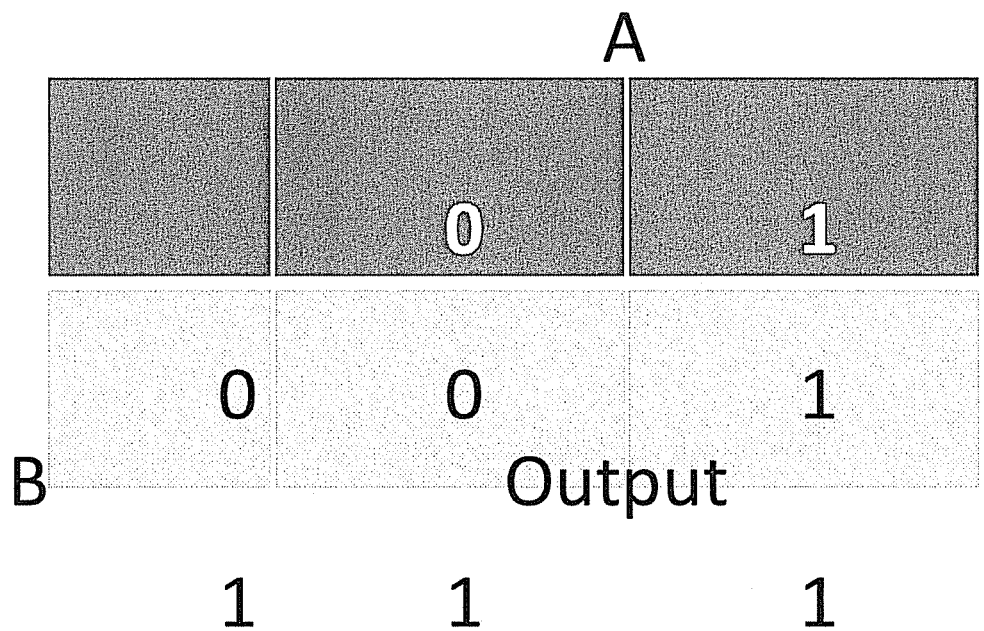
Figure 19:
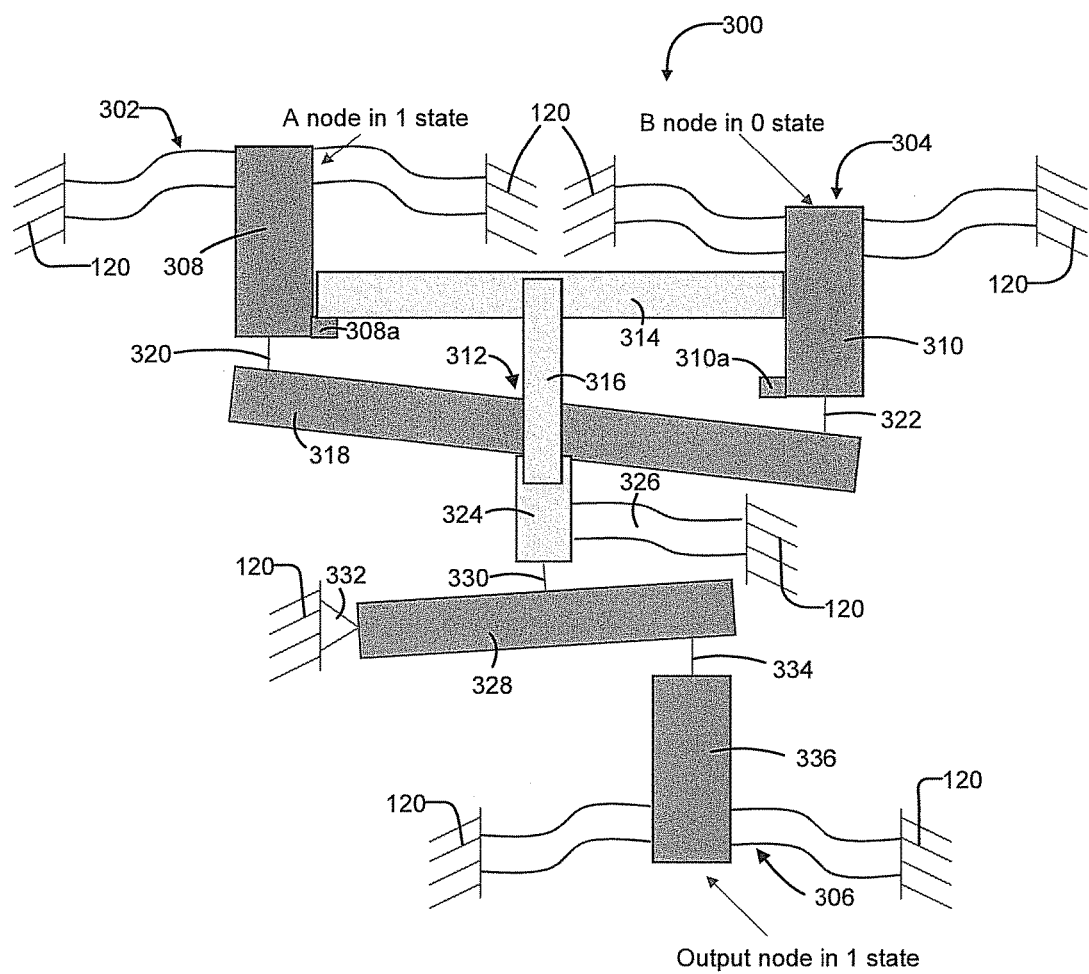
Figure 20:
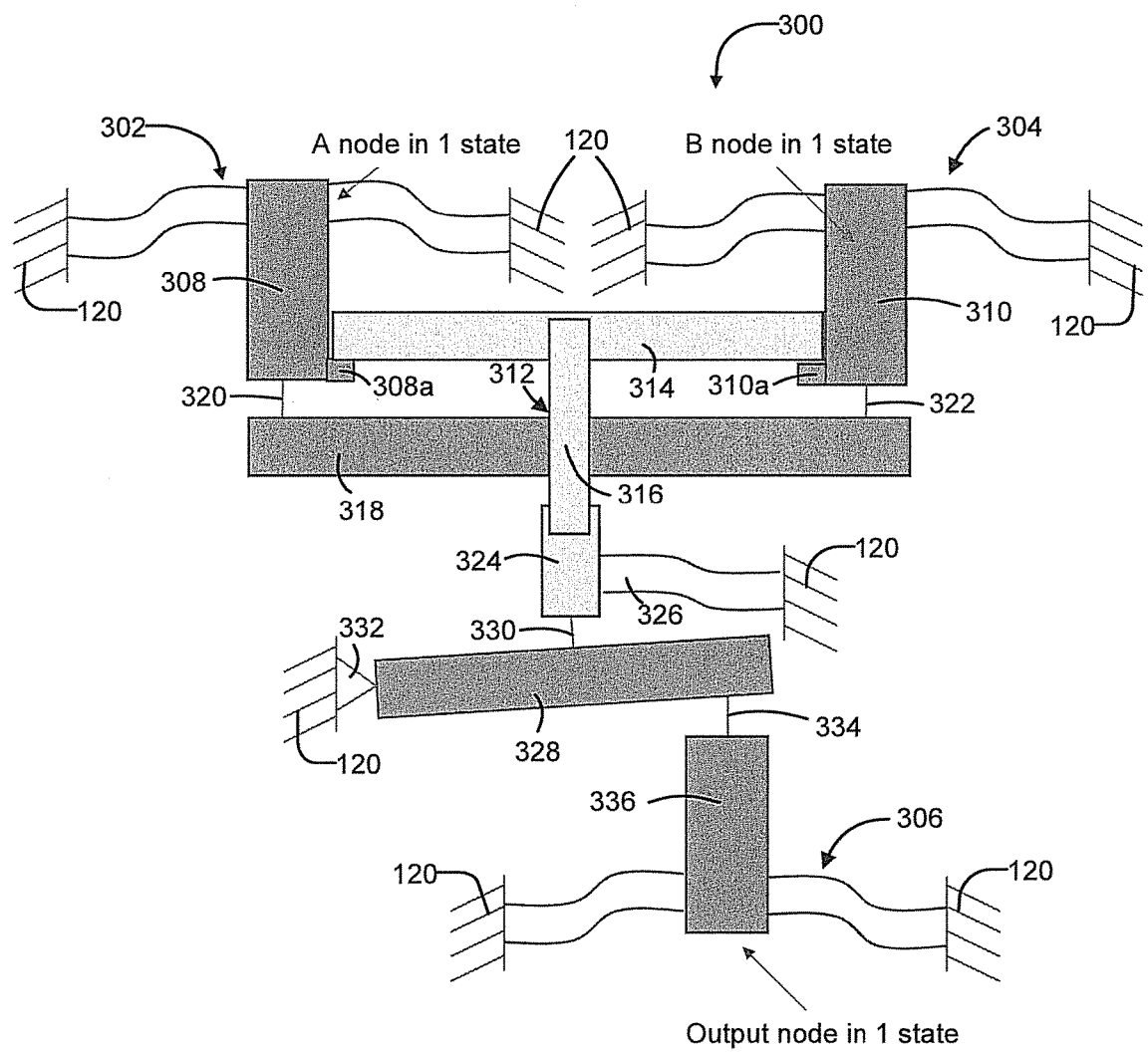
Figure 21:
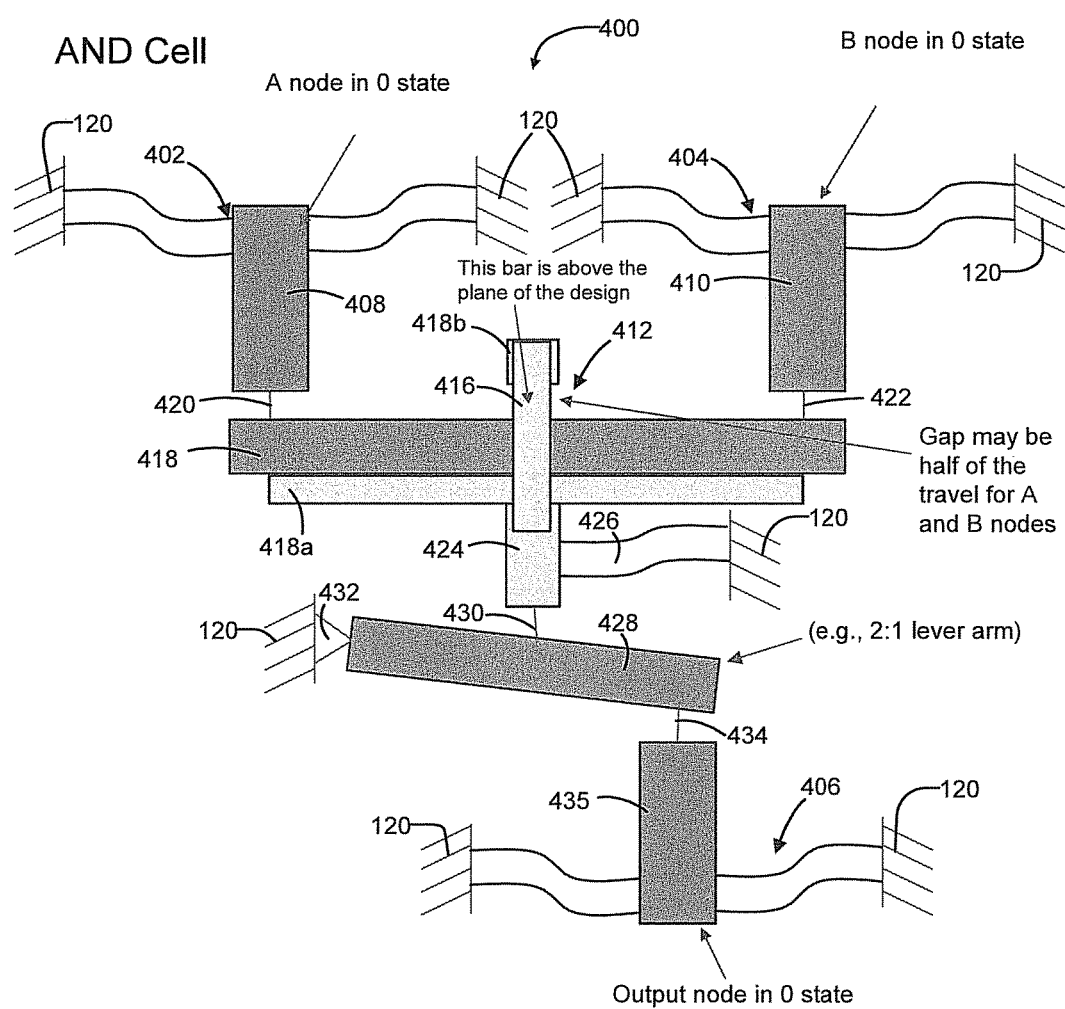
Figure 22:
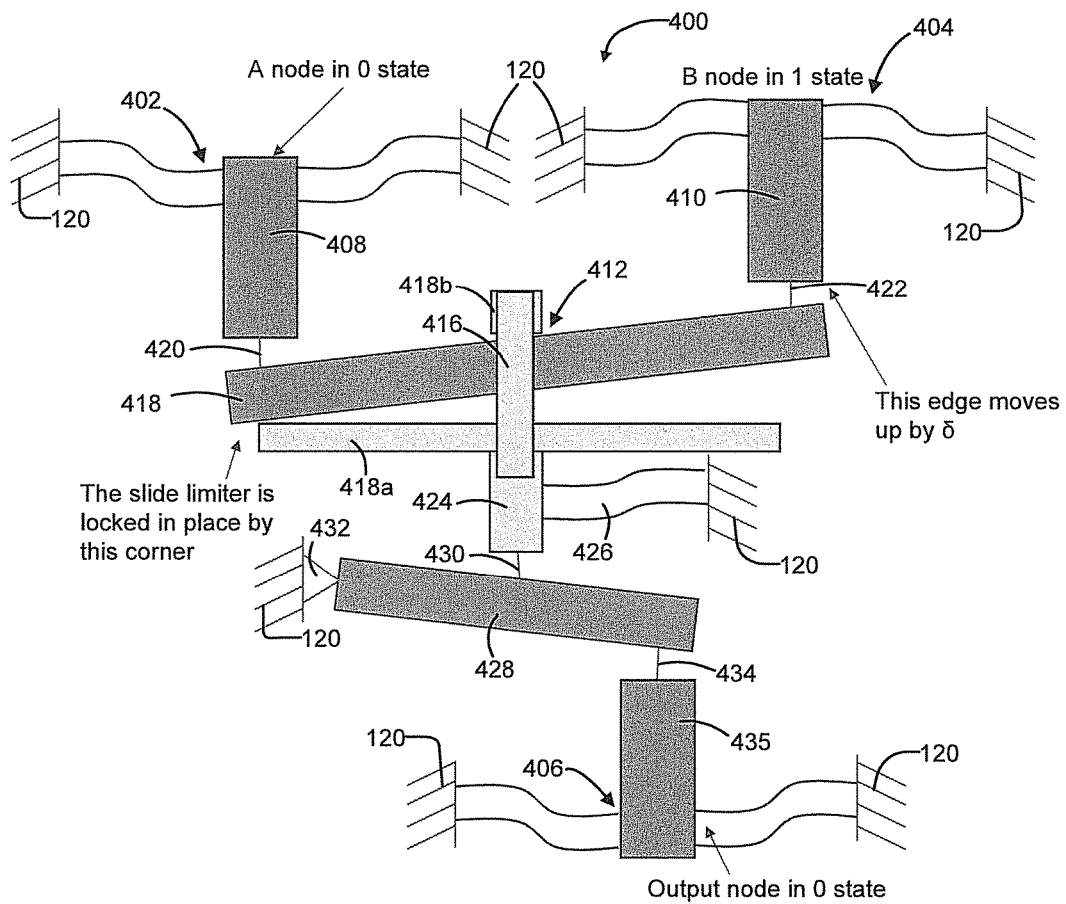
Figure 23:
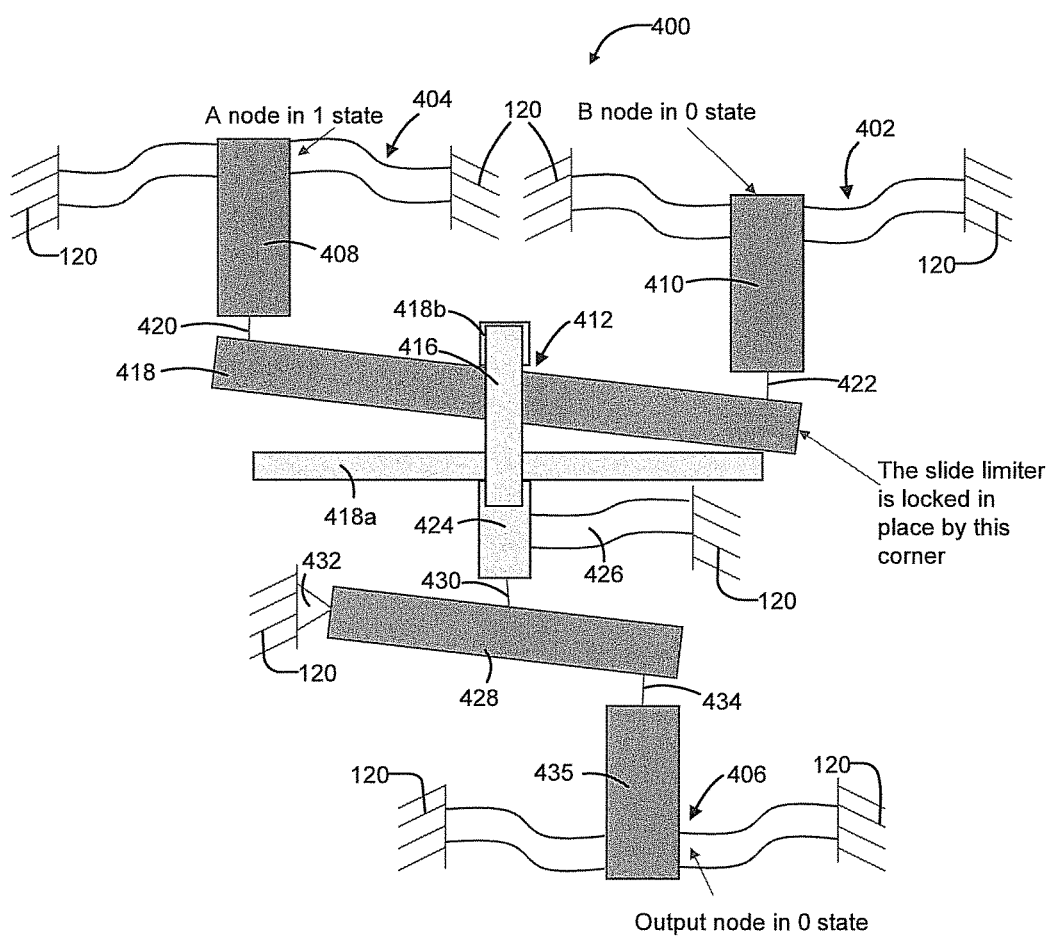
Figure 24:
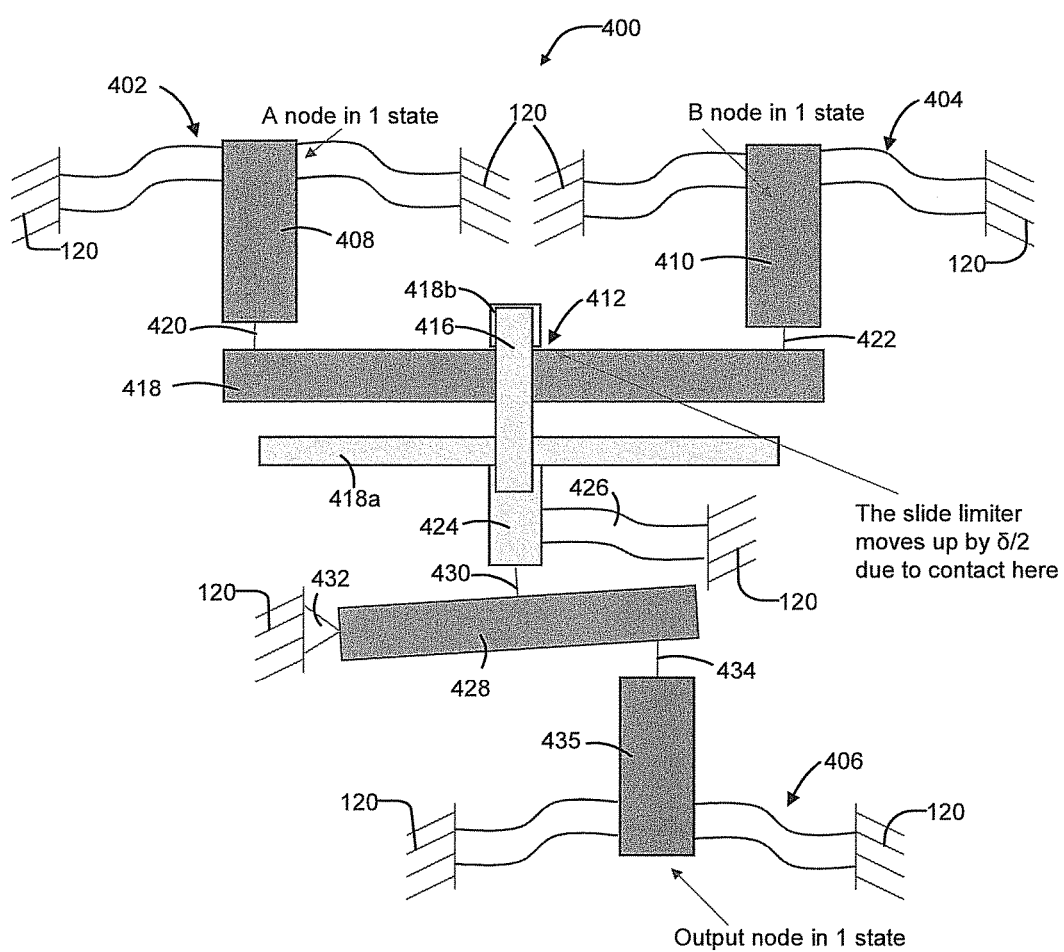
Figure 25:
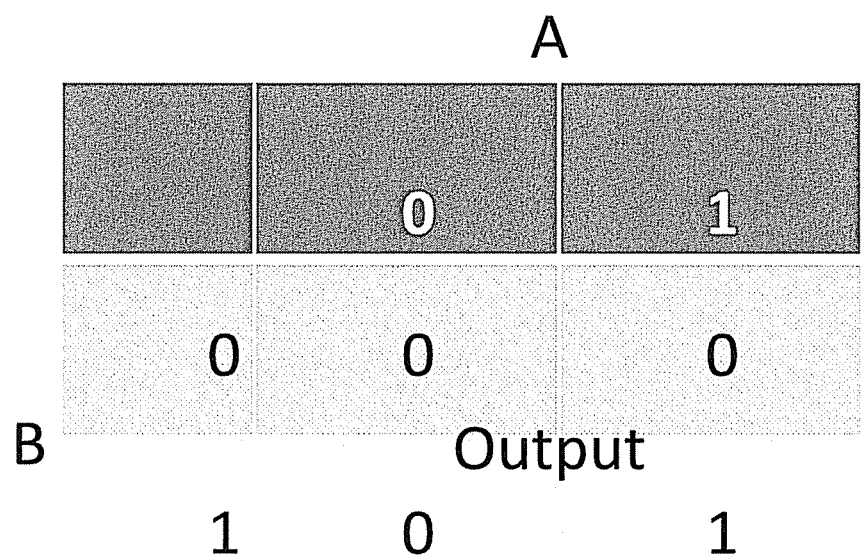
Figure 26:
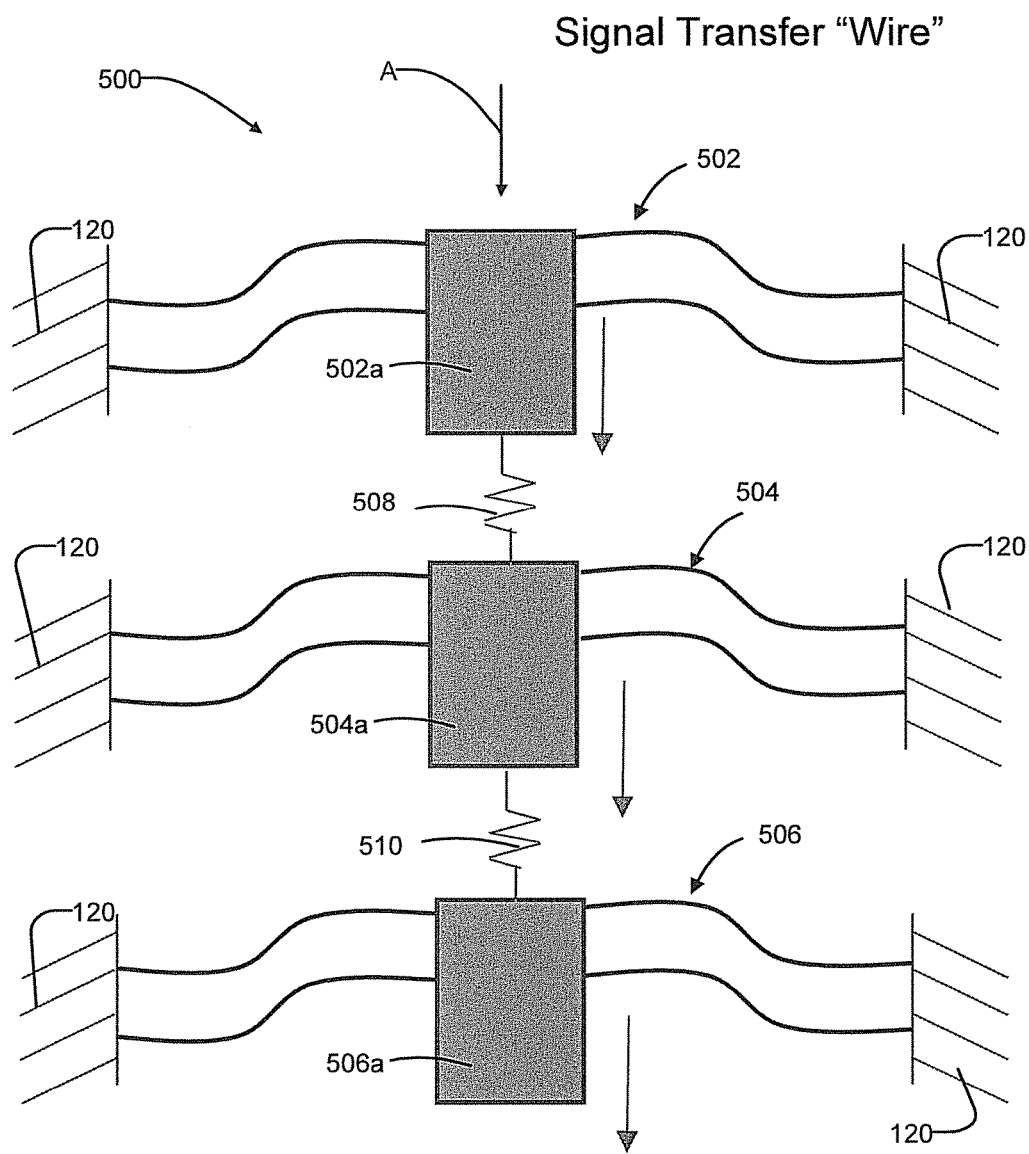
Figure 27:
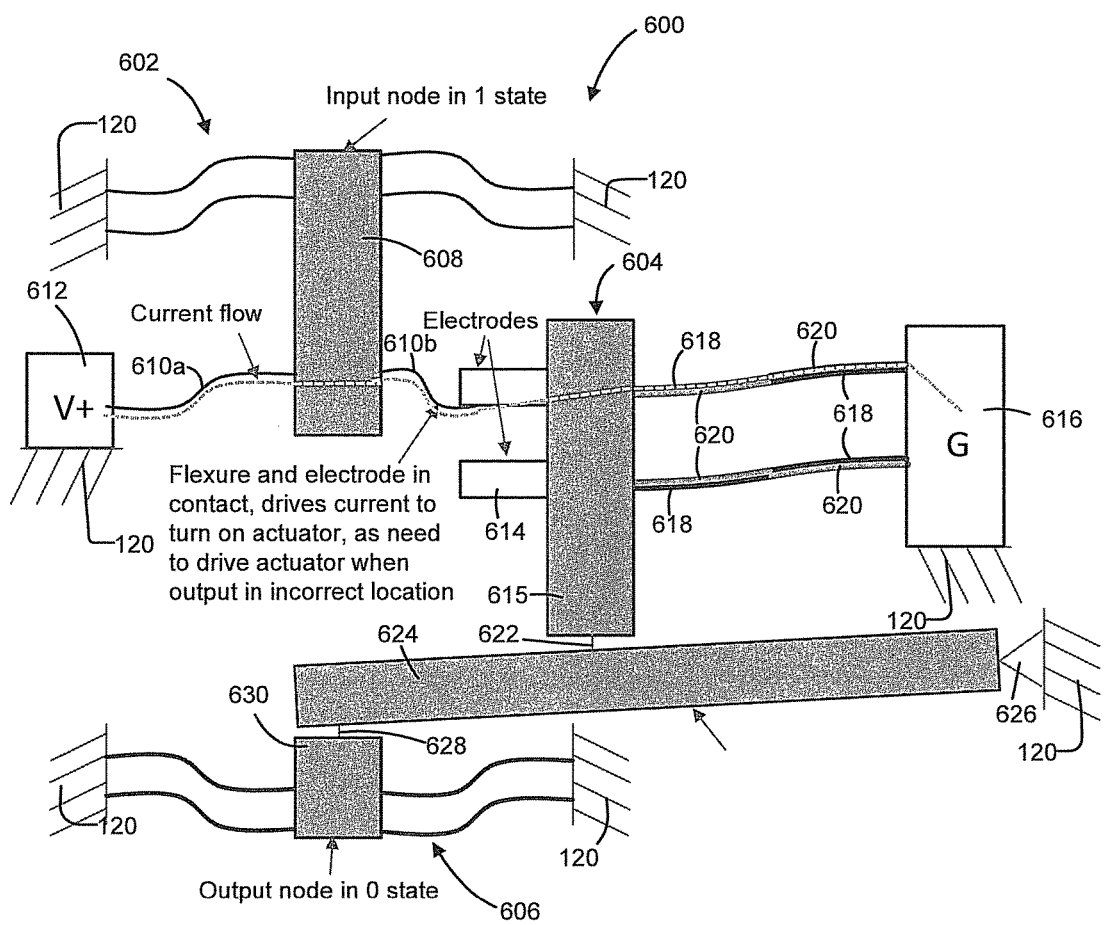
Figure 28:
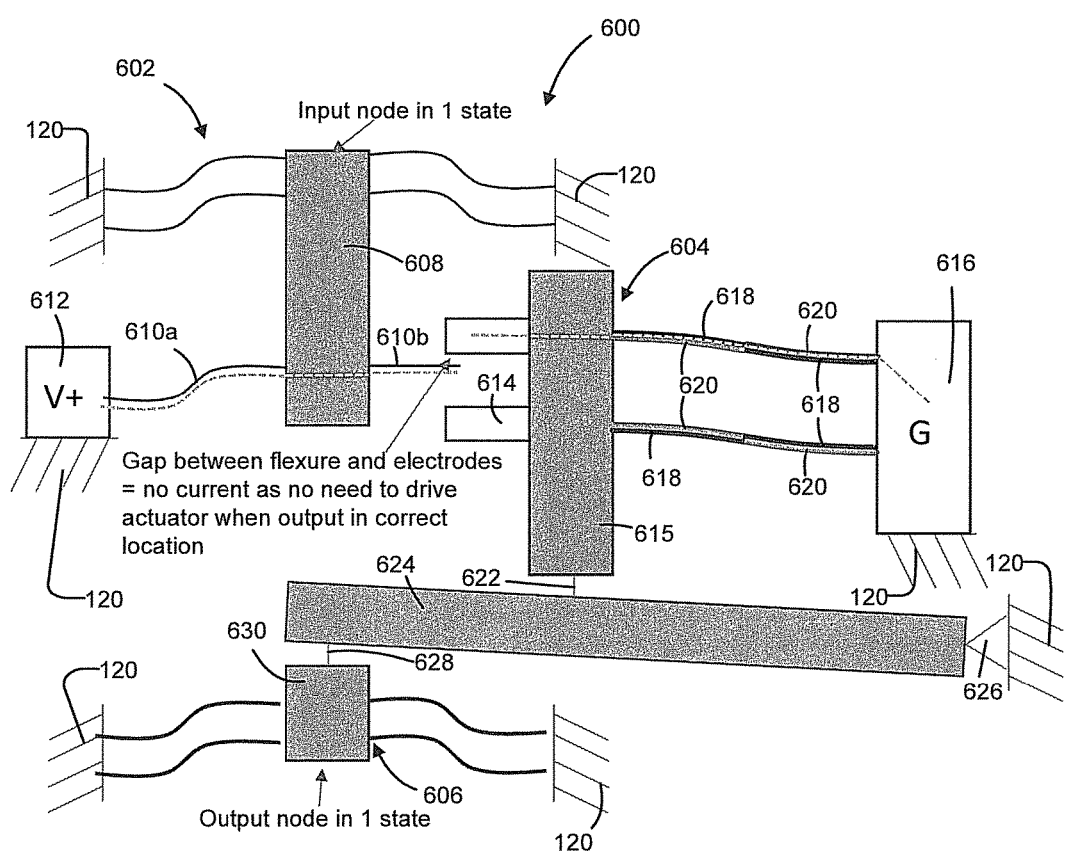
Figure 29:
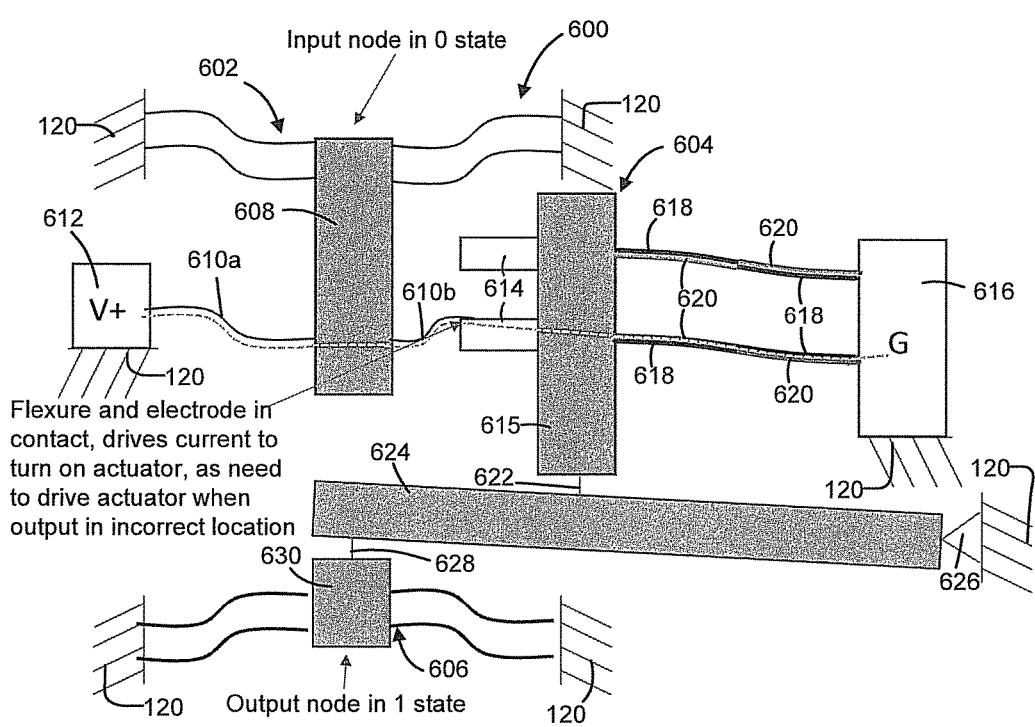
Figure 30:
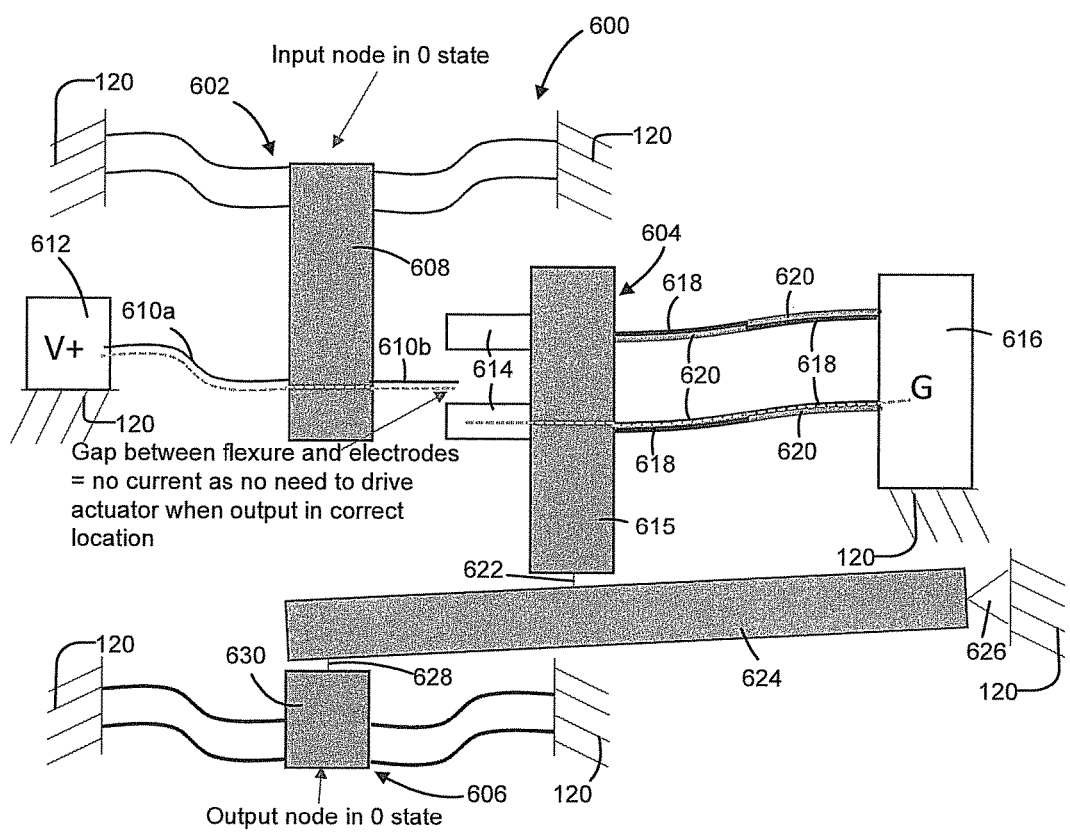

FIG. 10 shows the SRAM cell of FIG. 6 with the input flexure node in its logic 0 state, the output flexure node in its logic 1 state, and the gates in their logic 0 states;

FIG. 11 shows the SRAM cell with both of the input and output node flexures in their logic 0 states, but with the gates in their logic 1 states;

FIG. 12 shows the input and output node flexures in their logic 1 states, and with the gates both in their logic 1 states;

FIG. 13 shows a plurality of the bistable flexures used along with a pivotally supported beam to form a NOT cell, and where the input node flexure is shown in its logic 0 state producing a logic 1 level output at an output node flexure;

FIG. 14 shows the NOT cell of FIG. 13 with the input node flexure in its logic 1 state producing a logic 0 level output at the output node flexure;

FIG. 15 shows a truth table for the NOT cell of FIGS. 13 and 14;

FIG. 16 shows an OR cell formed using a pair of input node flexures, a slide limiter assembly, a lever arm and an output node flexure;

FIG. 17 shows the OR cell producing a logic 1 level output when only a second one of the input node flexures is in a logic 1 state;

FIG. 18 shows a truth table for the OR cell of FIG. 16;

FIG. 19 shows the OR cell producing a logic 1 state output when only the first one of the input node flexures is in a logic 1 state;

FIG. 20 shows the OR cell producing a logic 1 state output when both of the input node flexures are in their logic 1 states;

FIG. 21 shows an AND cell constructed using a plurality of bistable flexures, a slide limiter structure and a lever arm;

FIG. 22 shows the AND cell of FIG. 21 producing a logic 0 state output when only a second one of the input flexure nodes is in a logic 1 state;

FIG. 23 shows the AND cell of FIG. 21 producing a logic 0 state output when only the first input flexure node is in a logic 1 state;

FIG. 24 shows the AND cell of FIG. 21 producing a logic 1 state output when both of the input node flexures are in their logic 1 states;

FIG. 25 shows a truth table for the AND cell of FIG. 21;

FIG. 26 shows a signal transfer wire that may be formed by a sequential arrangement of bistable flexure nodes coupled in back to back fashion using biasing elements;

FIG. 27 shows an energy amplifier constructed from a plurality of bistable flexure nodes and an actuation shuttle, and where electrical power is provided to elements associated with the actuation shuttle to help control the output state of the amplifier;

FIG. 28 shows the energy amplifier of FIG. 27 but with the output node flexure having been driven to a logic 1 state by heating of energy responsive elements associated with the actuation shuttle when the input node flexure is in its logic 1 state;

FIG. 29 shows the energy amplifier of FIG. 27 but where the amplifier is in its active state with the input node flexure in its logic 0 state; and FIG. 30 is shows the energy amplifier of FIG. 27 but with the amplifier in a static state, where both of the input and output node flexures are in logic 0 states.

Corresponding reference numerals indicate corresponding parts throughout the several views of the drawings.

DETAILED DESCRIPTION

Example embodiments will now be described more fully with reference to the accompanying drawings.

Recent advancements in additive manufacturing, also called 3D printing, allow precise placement of materials in three dimensions. Lawrence Livermore National Laboratory's (LLNL's) Center for Engineered Materials and Manufacturing has recently demonstrated the ability to control the microarchitecture of materials with feature sizes down to 10 microns. This enables the design and manufacture of mechanical logic circuits and logic gates into the microstructure of a material creating so-called "material logic." Material logic allows basic calculations to be performed by the material itself with no electrical power input and low signatures. Furthermore, the microscale mechanical logic gates described herein provide a common interface that allows multiple gates to be linked together to form a logic circuit. This permits the flow of information to proceed mechanically from one gate to the next. A plurality of different types of inputs may be used to provide an input signal to the microstructure. For example, velocity, vibration, force and displacement may all be used as inputs.

Figure 1:
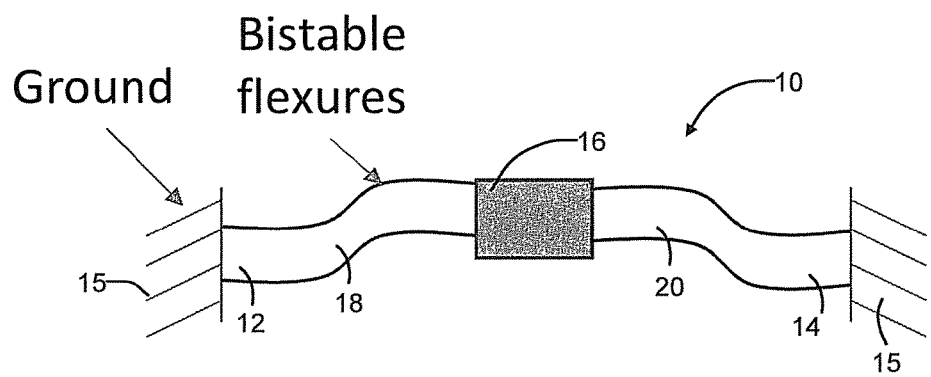
FIG. 1 is side view of one example of a bistable flexure in accordance with the present disclosure.

A building block of the microstructures formed in accordance with the teachings of the present invention is a resettable bistable element, which in this example forms a resettable bistable flexure 10, as shown in FIG. 1, and which may be formed as part of, or within, a material structure, for example a volume of material. The bistable flexure 10 (for convenience, hereinafter simply "flexure") in this example forms a microstructure that may be created by 3D printing methods or any other suitable manufacturing process, and which may be placed in either one of two different stable states. It is important to note, however, that non-bistable flexures may also be used in one or more of the embodiments described herein. Non-bistable flexures do not "pop" or "snap" between either one of two stable states. But as noted above, the abbreviated term "flexure" used herein refers to a bistable flexure.

Figure 2:
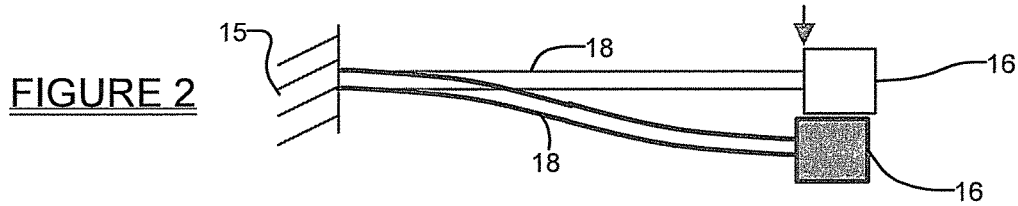
FIG. 2 shows a portion of the bistable flexure of FIG. 1 formed to provide a distributed compliance.
Figure 3:
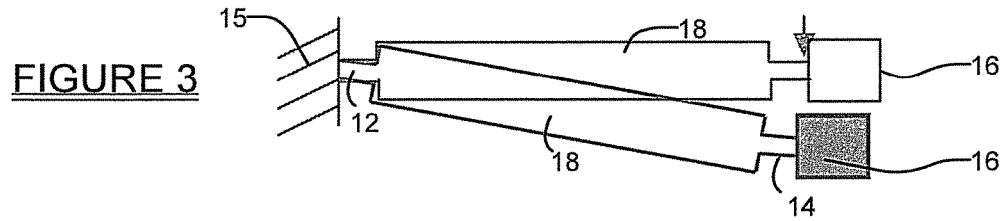
FIG. 3 shows a portion of the bistable flexure of FIG. 1 formed to provide a localized compliance.

The flexure 10 may be constructed of a material having a desired stiffness, which may be a linear stiffness or a non-linear stiffness. The flexure 10 may be supported at least at one of its opposite ends 12 and 14 to a non-movable structural component 15. In the example of FIG. 1 the flexure 10 is supported at both of its ends 12 and 14 to structural components 15. Lengths 18 and 20 form linkages which extend out from a center 16 of the flexure 10 on opposite sides of the center. The center 16 forms a point at which an input signal is applied. The flexure 10 may be constructed to provide a distributed compliance, as shown in FIG. 2, or with a localized compliance as shown in FIG. 3. With a distributed compliance, the lengths 18 and 20 of the flexure 10 on both sides of the center 16 gradually "distribute" the flexing movement over substantially a full span of each length 18 and 20 of material. With a localized compliance construction, the flexing movement occurs only at localized end points 12 and 14.

Figure 4:
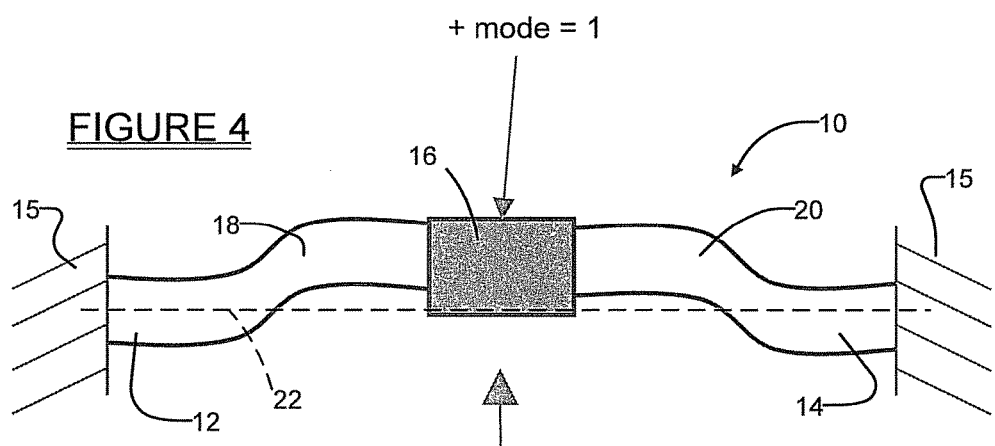
FIG. 4 shows the bistable flexure of FIG. 1 illustrating the flexure in its logic 1 state and showing, via a dashed line, its position of highest stress, which also forms an "over center" point of movement for the flexure.
Figure 5:
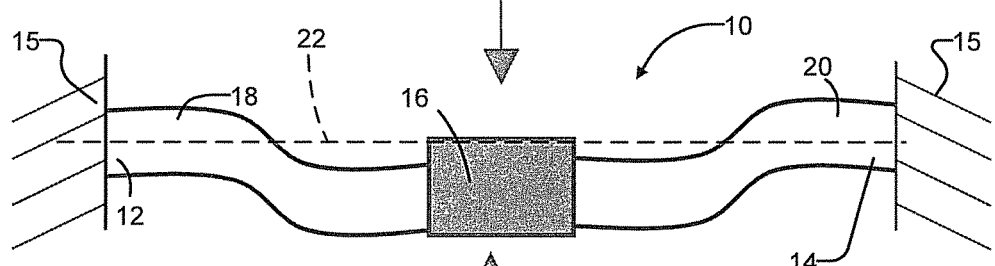
FIG. 5 shows the bistable flexure of FIG. 1 in its logic 0 state.

With reference to FIGS. 4 and 5, a key feature of the flexure 10 is its ability to remain in a given position or state once moved into that position or state, without the further application of a force to the flexure. This characteristic is achieved by manufacturing the flexure 10, for example in a 3D printing process, so that an increasing stress exists on the flexure and correspondingly increased potential energy as it is moved from one stable position toward an equilibrium point or "zero location", shown by dashed line 22 in FIGS. 4 and 5, by a force applied at center point 16. Once the flexure 10 begins to just move past the zero location 22, the stress and thus potential energy begins to decrease, so it flexes without a further input force into the other stable position. This movement is shown in FIGS. 4 and 5, with the flexure position of FIG. 4 designated as a "+mode" or logic "1" state, and the position in FIG. 5 designated as a "−mode" or logic "0" state. When in either the logic 1 state or the logic 0 state, the stress on the flexure 10 is at its minimum, and when at the zero location 22, stress is at a maximum.

The flexure 10 may be used to form a number of distinct mechanical circuits. One other element helps to enable the bistable flexure to form the desired logic. This is a nonlinear stiffness linking the gates of the circuit. With bistable flexures and a non-linear linkage, resettable mechanical logic circuits can be created based on displacement signals (meaning the signal is contained in the location or relative displacement of the element). FIG. 6 shows a resettable static random access memory (SRAM) cell 100 which may be formed as part of, or within, a material structure or a volume of material. The SRAM cell 100 may make use of one flexure 102 forming an input node, another flexure 104 forming an output node, two flexures 106 and 108 forming gates. A material portion forming a center node 110 is connected through two rigid sections of material 112 and 114 and positioned between rigid material lengths 116 and 118. In this example material sections 112, 114 and center node cooperatively form a non-linear stiffness.

Figure 7:
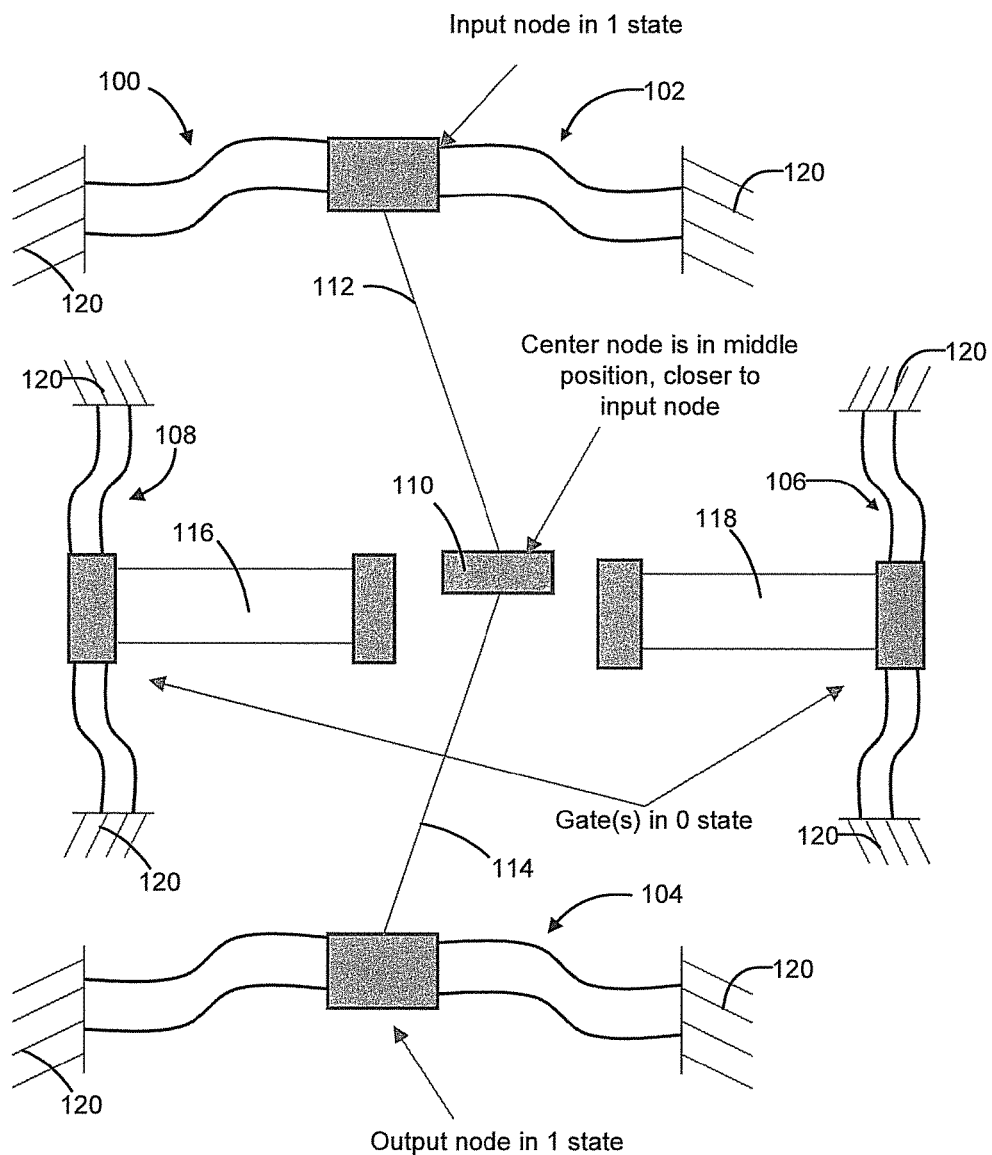
FIG. 7 shows the SRAM cell of FIG. 6 with the input node flexure and the output node flexure both in their logic 1 states and the gates in their logic 0 states.
Figure 8:
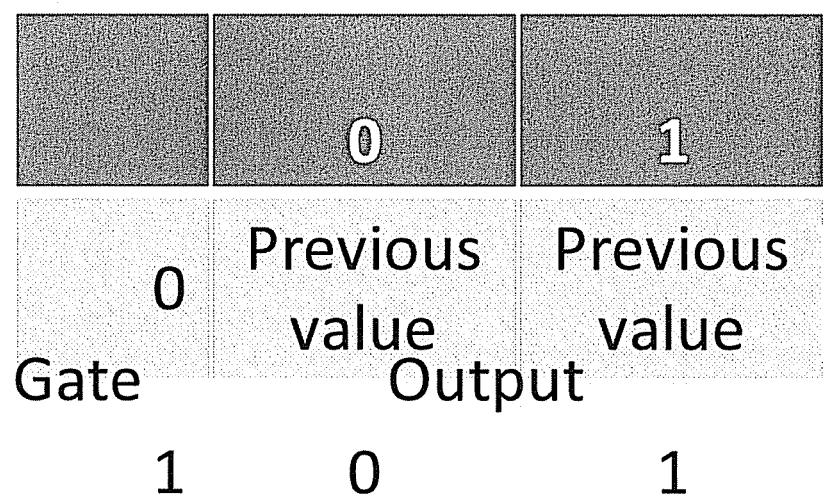
FIG. 8 shows a truth table for the SRAM cell of FIG. 6.

Material length 116 is coupled to flexure gate 108 and material length 118 is coupled to gate flexure 106. For simplicity, all of non-movable structures have been labelled with reference number 120, although it will be appreciated that these may be independent, non-movable structures. In this example, the gate flexures 108 and 110 are each in their logic 0 states, leaving a space for the center node 110 to move laterally. In other words, center node 110 is not constrained by the material lengths 116 and 118 to only move vertically in this example. Moving input node flexure 102 from its 1 state (shown in FIG. 6) to its logic 0 state will not cause a corresponding movement of the output node flexure 104 because rigid material length 112 is free to translate laterally and slightly vertically in response to input node flexure 102 moving to its logic 0 state. If the output node flexure 104 was previously in its logic 1 state, as shown in FIG. 7, there will still be no change in state of the output node flexure 104 if the input node flexure 102 moves from its logic 1 state to its logic 0 state, because of the ability of the node 110 to translate laterally when the gate flexures 108 are both in their logic 0 states. A truth table associated with the operation of the SRAM cell 100 is shown in FIG. 8.

Figure 9:
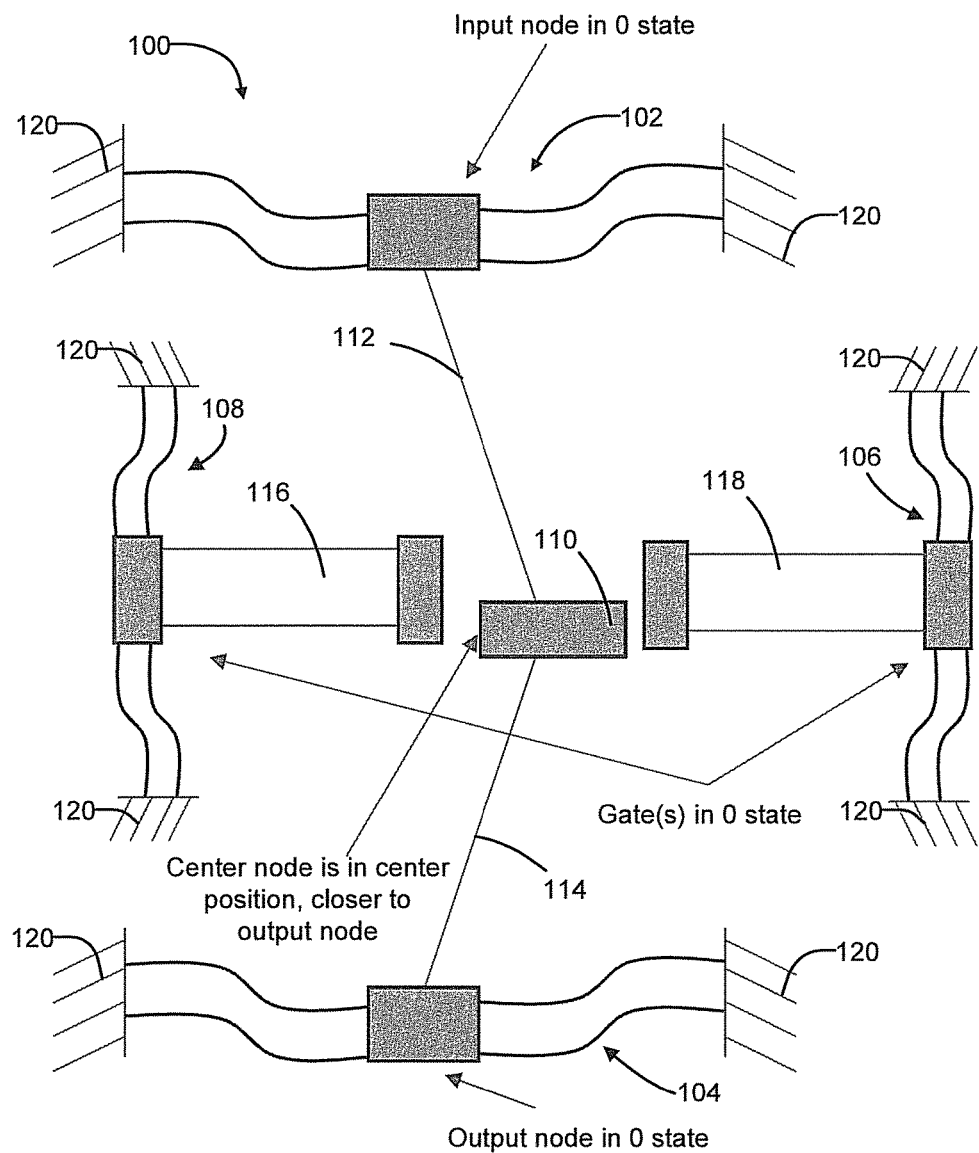
FIG. 9 shows the SRAM cell of FIG. 6 with both of the input node flexure and the output node flexure in their logic 0 states, and the gates in their logic 0 states.

FIG. 9 illustrates the SRAM cell 100 but with the input node flexure 102 in its 0 state. No change in the output state of output node 104 can occur when the gates 108 and 110 are both in their logic 0 states. Lateral movement of the node 110 is permitted, which prevents a logic 1 to logic 0 state change of the input node 102 from causing a state change in the output node 104. FIG. 10 shows that no state change occurs in the output node 104 when the state of the input node changes from logic 1 to logic 0 even when the output node 104 was previously in the logic 1 state. This is because of the lateral movement of the center node 110 which is allowed when the gates are in their logic 0 states.

FIGS. 11 and 12 illustrate that with the SRAM 100, when the gate node flexures 106 and 108 are in their logic 1 state, the output node flexure 104 is "locked" to the input node flexure 102. This means that movement of the input node flexure 102 from the logic 0 state to the logic 1 state causes a corresponding movement of the output flexure from the logic 0 state to the logic 1 state, as shown in FIG. 12. The movement of rigid material lengths 116 and 118, when the gate flexures 106 and 108 are moved from their logic 0 states to their logic 1 states, constrains lateral movement of the center node 110, restricting its movement to a vertical movement when the input node moves from the logic 0 state to the logic 1 state. Thus, when the gate flexures 106 and 108 are in their logic 1 states, this condition, or "mode", may be termed a "memory write" mode.

FIGS. 13 and 14 illustrate one example of a resettable "NOT" cell 200 which may be formed as part of, or within, a material structure or volume of material. The NOT cell 200 may be constructed using an input node flexure 202, an output node flexure 204, a first L-shaped rigid element 206, a second L-shaped rigid element 208 and a rigid beam 209. The rigid beam 209 is supported for pivoting motion at its center point by material elements 212. Opposing ends of the rigid beam 209 are coupled by rigid elements 214 and 216 to the L-shaped rigid elements 208 and 210, respectively. FIG. 13 shows the input node flexure 202 in its logic 0 state. The rigid beam 209 causes the output flexure to assume its logic 1 state. This is also illustrated by the truth table of FIG. 15. FIG. 14 illustrates that movement of the input node flexure 202 from the logic 0 state to the logic 1 state causes a corresponding movement of the output node flexure 204 from the logic 1 state to the logic 0 state. This is also indicated by the truth table of FIG. 15. The state of the output node flexure 204 will thus always be opposite to that of the input node flexure 202.

FIG. 16 shows a resettable OR cell 300 which may be formed as part of a material structure, or within a material structure or volume of material. The OR cell 200 may use a first input node flexure 302, a second input node flexure 304 and an output node flexure 306. Input node flexure 302 has a depending rigid member 308 and input node flexure 304 has a like, rigid depending member 310. Depending member 308 has a shoulder 308a and depending member 310 has a like shoulder 310a. A slide limiter structure 312 is positioned between the depending members 308 and 310 and includes a first beam 314 with a perpendicular second beam 316 coupled to the first beam 314. The spacing between the first beam 314 and the shoulders 308a and 310a is preferably about ½ of the distance of travel of the input node flexures 302 and 304. The slide limiter structure 312 also includes a third beam 318 which is pivotally coupled at its midpoint to the second beam 316, and at its opposing ends by material lengths 320 and 322. The second beam 316 is also coupled to an intermediate element 324 which is supported by a material section 326. Intermediate element 324 is free to move up and down and is coupled to a lever arm 328 via material length 330. The lever arm 328 in this example is a 2:1 lever arm. The lever arm 328 is itself coupled via a flexure forming a living hinge 332 to rigid structure 120, and via a material length 334 to a depending rigid member 336 associated with the output node flexure 306.

With reference to FIG. 17, when either of the input flexure nodes 302 or 304 is moved from its logic 0 state to its logic 1 state, this causes movement of one of the shoulder portions 308*a* or 310*a* upwardly, which lifts the first beam 314. This causes a corresponding lifting of the intermediate element 324 which pivots the lever arm 328, thus lifting the material length 330 and the output node flexure 306 into its logic 1 state. If the other one of the input flexure nodes 302 or 304 is then also moved into the logic 1 state, this causes no change in the state of the output node flexure 306; the output node flexure 306 is essentially "locked" in its logic 1 state when either of the input node flexures 302 or 304 is in its logic 1 state. The truth table for the OR cell 300 is shown in FIG. 18. FIG. 19 shows the OR cell 300 with only input node flexure 302 in its logic 1 state, producing a logic 1 state at the output flexure node 306. FIG. 20 illustrates the output node flexure 306 also having a 1 state when both of the input flexure nodes 302 and 304 are in their logic 1 states.

FIG. 21 shows a resettable "AND" cell 400 in accordance with another embodiment of the present disclosure which may be formed as part of a material structure, or within a material structure or volume of material. The AND cell 400 is somewhat similar in construction to the OR cell 300 and includes input node flexures 402 and 404, depending legs 408 and 410, and slide limiter structure 412. Slide limiter structure 412 includes a guide beam 416, a movable beam 418, a non-movable support beam 418*a*, and a fixed base 424. Support beam 418*a* is coupled to guide beam 416. The movable beam 418 is coupled at its opposing ends via material length 420 to the depending leg 408 and via material length 422 to depending leg 410. Each end of the movable beam 418 may move by itself in response to movement of either of the input node flexures 402 or 404, or the entire movable beam 418 may translate vertically in FIG. 21 in response to both of the input node flexures 402 and 404 moving into their logic 1 states. Thus, the beam 418 is movable not only pivotally but may move in a translating movement as well.

A cap 418*b* may be coupled to a distal end of the guide beam 416. The distance between a lower edge of the cap 418*b* and an upper surface of the movable beam 418 may be preferably about ½ of the total vertical movement of the each of the input node flexures 402 and 404. The fixed base 424 may be coupled via a resilient material length 426 to rigid structure 120 and via a material length 430 to a lever arm 428 at a midpoint of the lever arm 428. Lever arm 428 is also coupled at one end via a flexure forming a living hinge 432 to fixed structure 120, and at its opposite end via material length 434 to the depending leg 435 of the output node flexure 406.

As shown in FIG. 21, when both of the input node flexures 402 and 404 are in their 0 states, the output node flexure 406 will be in its logic 0 state. In FIG. 22, when the input node flexure 404 is in its logic 1 state while input node flexure 402 is in its logic 0 state, the output node flexure 406 will be in its logic 1 state. FIG. 23 shows that when the input node flexure 402 is in its logic 1 state while the input node flexure 404 is in its logic 0 state, with the output node flexure 406 will still be in its logic 1 state. FIG. 24 shows the OR cell 400 with both input node flexures 402 and 404 in their logic 1 state producing a logic 1 state at the output node flexure 406. A truth table for the AND cell 400 is shown in FIG. 25.

FIG. 26 illustrates another embodiment of the present disclosure forming a resettable signal transfer "wire" circuit 500 which may be formed as part of a material structure, or within a material structure or volume of material. In this embodiment the signal transfer wire circuit 500 is formed by a plurality of aligned flexures 502, 504 and 506, although it will be appreciated that a greater or lesser plurality of flexures may be used. Also, while the flexures 502, 504 and 506 are shown in a linear orientation, the signal transfer wire circuit 500 could be formed to make one or more turns.

In the example shown in FIG. 26, the flexure 502 has a depending leg 502*a* that is coupled via a biasing element 508 to the flexure 502. A depending leg 504*a* of flexure 504 is coupled via a biasing element 510 to flexure 506. An input signal (displacement, pressure, velocity, etc.) applied to the flexure 502 along arrow "A" causes a travelling wave of buckling of the flexures 502-506. The travelling wave carries a set pulse of energy (substantially with minimal dissipation) through each flexure 502-506. The energy pulse can be used to send signals between logic cells operably associated with each of the flexures 502-506. Essentially, a single energy pulse can be used to send a signal to a relatively large plurality of different flexures to signal or otherwise help control other logic systems. The input signal to the first flexure 502 may be based on vibration, thermal or even an optical (e.g., RF) input source. This signal transfer wire circuit 500 only transmits the energy pulse, but does not amplify the energy. The energy pulse may be defined as the energy stored in the bistable structure as pre-loaded mechanical strain. A load on the first bistable flexure 502 will build up force on the second bistable flexure 504, until the first moves through its unstable center equilibrium, and settles into the new state. This sudden release of energy applies a high load to the next bistable flexure 504, likewise forcing it through to its new state. The process continues down the chain, passing the energy pulse from one bistable flexure element in the circuit to the next. The pulse is not attenuated, as each bistable flexure releases it in reaching the new state.

FIG. 27 shows one example of a resettable energy amplifier 600 in accordance with another embodiment of the present disclosure. The energy amplification cell is intended to read in the signal from a bistable flexure with a low stored energy value, and pass that signal to a bistable flexure with a higher stored energy value. This cannot be done passively due to energy conservation, so an active cell design is required to provide the excess energy to force the output to the right state. Such energy amplification works like an operational amplifier in electronics, where small signals are read in and used to drive large output changes. Mechanically speaking, a low energy pulse may arrive from a small sensor. This may be needed to cause a large change in a SRAM cell, but that change may require a larger pulse of energy than supplied by the sensor. In this case, placing an energy amplifier to read from the sensor and output to the SRAM cell will decouple the two and ensure the small signal is read from the sensor and stored in the SRAM cell. Pulses of different energy levels may be needed to read or write information to the SRAM cells, as well as changing other parts of the mechanical logic. Energy amplifier cells decouple Signal from energy scale and so provide a means to ensure the logic works regardless of the energy scale required.

The energy amplifier circuit 600 of FIG. 27 may be formed as part of, or within, a material structure or volume of material. The energy amplifier circuit 600 may include a low energy input node flexure 602, an actuation shuttle 604 and a high energy output node flexure 606. The input node flexure 602 includes a depending leg portion 608 which is coupled via a flexible conductor 610*a* to a power source 612, which may be a high voltage power source, and via a rigid electrical conductor 610*b* to either one of a pair of electrodes 614 associated with a movable element 615 of the actuation shuttle 604. The actuation shuttle 604 and its electrodes 614 may also be electrically and mechanically coupled to an electrical ground 616 via flexible lengths of material 620 having energy responsive film layers 618 on one or both sides thereof. Thus, when the actuation shuttle 604 is in the position show in FIG. 27, a complete circuit path is formed between the power source 612 and the ground 616. The energy responsive film layers 618 may be thermally responsive bimorph layers, piezoelectric material layers or any other form of electrically responsive material layers.

The movable member 614 of the actuation shuttle 604 may also be coupled via a material length 622 to a pivotally supported beam 624. Beam 624 may be supported at one end by a flexure forming a living hinge 626 so that it is free to articulate about the living hinge 626. The beam 624 is coupled at its distal end by a material length 628 to a depending leg 630 associated with the output node flexure 606. The energy amplifier circuit 600 is in its active state when the input node flexure 602 is in its logic 1 state and the output node flexure 606 is in its logic 0 state. In this condition electric current is able to flow through electrical conductors 610*a*, 610*b* and energy responsive layers 618 to ground 616. If the energy responsive layers 618 are bimorph layers, they will heat up over time, causing the layers to expand. As the energy responsive layers 618 expand, they will drive the actuation shuttle 604 upwardly in the illustration of FIG. 27, thus lifting the beam 624. The pivoting motion of the beam 624 moves the output node flexure 606 into its logic 1 state.

The beam 624, which forms a lever, may either amplify or de-amplify the displacement of the actuation shuttle 604. This allows the force/displacement relationship of the energy amplifier circuit 600 to be tuned to best meet the needs of a specific application. In one specific implementation, the energy amplifier circuit 600 forms an approximately 3:2 displacement amplification lever, meaning a magnitude movement of 2 of the actuation shuttle will produce a magnitude movement of 3 at the output flexure 606. The energy amplifier 600 circuit further enables the input node flexure 602 to be physically uncoupled from the output node flexure 606. By this construction, even small magnitude energy pulses can be used to activate (i.e., trip) the input node flexure 602, regardless of the energy pulse required to trip the output node flexure 606.

It will also be appreciated that while the energy amplifier circuit 600 circuit has been shown using the electrical power source 612, the energy used may also be harvested from the environment or gathered from an alternative energy source. Other actuators could also be used (spring/mass energy storage, fluidic, hydraulic, chemical, etc.), and the energy amplifier circuit 600 therefore represents just one specific mechanical amplifier circuit design; numerous other designs are possible as well. In still other embodiments, the actuation shuttle 604 may make use of a magnet and coils or a solenoid assembly that is electrically energized with a suitable electrical signal.

FIG. 28 shows the energy amplifier circuit 600 after having its output driven up to 1 by vertical movement of the actuation shuttle 604. The conductive path through the actuation shuttle 604 has been broken by the movement of the actuation shuttle. Thus, there is no need to continue driving the actuation shuttle 604 with an electrical signal. The bi-stability of the output node flexure 606 serves to hold the output node flexure in its 1 state even after the electrical current to the actuation shuttle 604 is interrupted. In effect, this enables the actuation shuttle 604 to avoid wasting power when the output is in the correct state. This reduces energy use by the amplifier cell.

FIG. 29 shows the energy amplifier circuit 600 in the active state where input node flexure 602 is in its 0 state and the output node flexure is in its 1 state. The conductive path to the actuation shuttle 604 is completed and provides current to heat the energy responsive film layers 618 on the flexible material length 620. This results in heating of the energy responsive film layers 618 on the material length 620, which over time will drive the actuation shuttle 604 down, lowering the output node flexure from the 1 state to the 0 state. FIG. 30 shows the output flexure node 606 having been driven up to the 0 state from the 1 state. Electrical current flow through the actuation shuttle 604 has been interrupted. The bi-stability of the output node flexure 606 holds it in its present location even after current flow to the actuation shuttle 604 is interrupted.

From the foregoing it will be apparent that the teachings of the present disclosure may be used to form, without limitation, a wide range of logic/gating systems, mechanical latch systems, and mechanical amplifier systems. A particular advantage of the bistable flexure and the mechanical logic circuits described herein is their ability to be "reset" or moved back to an initial state, and used repeatedly for computation or control operations. This is a significant advantage of existing mechanical logic circuits which are not "resettable", and offer single capability only. The bistable flexures and mechanical logic gates and cells described herein are all capable of being reset or movable back to an initial configuration. This greatly expands the number of potential applications that the mechanical logic cells and gates described herein may be used in.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise.

The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A resettable mechanical logic circuit formed as part of a material structure, the circuit comprising:
   a first pair of bistable elements, a first one of the pair forming an input node flexure and the other one of the pair forming an output node flexure, each of the input and output node flexures having a logic 1 state and a logic 0 state corresponding to their two positions of low potential energy;
   a second pair of bistable elements arranged non-parallel to the first pair of bistable elements, the second pair of the bistable elements each forming a gate for applying a gate signal, and each having a logic 1 state and a logic 0 state;
   each said bistable element having a characteristic of being stable in either one of first and second orientations, once moved past a midpoint orientation between the first and second orientations by an input signal;
   center material portions arranged between each of the bistable elements of each one of the first and second pairs of bistable elements;
   rigid material lengths forming linkages coupling center material portions of each of the bistable elements to a center node; and
   wherein orientations of the second pair of bistable elements control generation of the gate signals which form an input signal, the input signal controlling whether a change in state of the input node flexure from the logic 1 state to the logic 0 state enables a change in state of the output node flexure.

2. The circuit of claim 1, wherein a state change of the output flexure node in response to an input signal applied to the input flexure node only occurs when both ones of the second pair of bistable elements are in logic 1 states.

3. The circuit of claim 2, wherein the circuit forms a static random access memory.

4. The circuit of claim 1, wherein movement of the input node flexure into its logic 0 state causes rotation of a beam which causes movement of the output node flexure into its logic 1 state.

5. The circuit of claim 1, wherein the circuit forms a NOT cell.

6. A resettable mechanical logic circuit formed as part of a material structure, the circuit comprising:
   a pair of bistable input node elements each formed as a length of material supported at opposite ends thereof, each of said bistable input node elements having first and second orientations of low potential energy separated by a midpoint of high potential energy, each said bistable input node element being movable by an input signal applied to a center area of its length toward the midpoint of high potential energy;
   a bistable output node element formed as a length of material supported at least at one end thereof, and having first and second orientations of low potential energy separated by a midpoint of high potential energy, said bistable output node element being movable by an input signal applied to a center area of its length toward the midpoint of high potential energy;
   each of the bistable input node elements and the bistable output node element having a characteristic of being stable in either of its first and second orientations of low potential energy, once moved past the midpoint of high potential energy;
   a slide limiter structure interposed between the pair of bistable input node elements and the output node element, the slide limiter structure including a beam, and being operatively coupled to the center areas of each of the bistable input node elements at outer ends of the beam, and the beam being movable pivotally about a midpoint thereof;
   a lever arm beam operatively coupled to a midpoint of the slide limiter structure, and at one distal end operatively to the center area of the output node element;
   and wherein movement of either one of the input node elements from its logic 0 state to its logic 1 state causes movement of the output node element from its logic 0 state to its logic 1.

7. The circuit of claim 6, wherein movement of the output node element from its logic 1 state to its logic 0 state occurs only when both of the input node elements are moved into their logic 0 states.

8. The logic circuit of claim 6, wherein movement of the second one of the input node elements from its logic 0 state to its logic 1 state, while the first one of the input node elements is already in its logic 1 state, causes no change in the state of the output node element.

9. The logic circuit of claim 1, wherein the bistable elements of at least one of the first and second pairs of bistable elements comprise non-linear, displacement dependent stiffness.

10. A resetable mechanical logic AND circuit formed as part of a material structure, the circuit comprising:
   a pair of bistable input node elements each formed as a length of material supported at opposite ends thereof, each said bistable input node element having first and second orientations of low potential energy separated by a midpoint of high potential energy, each said bistable input node element being movable by an input signal applied to a center area of its length toward the midpoint of high potential energy;
   a bistable output node element formed as a length of material supported at opposite ends thereof, and having first and second orientations of low potential energy separated by a midpoint of high potential energy, said bistable output node element being movable by an input signal applied to a center area of its length toward a midpoint of high strength;
   each of the bistable input node elements and the bistable output node element having a characteristic of being stable in either of its first and second orientations of low potential energy, once moved past the midpoint of high potential energy;
   a slide limiter structure interposed between the pair of bistable input node elements and the bistable output node element, the slide limiter structure including a beam, and the center areas of each of the bistable input node elements being coupled to outer ends of the beam, and the beam being movable pivotally about a midpoint thereof as well as translatable in a linear direction;
   a lever arm beam operatively coupled to a midpoint of the slide limiter structure, and at one distal end operatively to the center area of the bistable output node element;
   and wherein movement of only one of the bistable input node elements from its logic 0 state to its logic 1 state, while the other one of the bistable input node elements is in its logic 0 state, is not sufficient for the slide limiter structure to cause movement of the bistable output node element from its logic 0 state to its logic 1 state.

11. The circuit of claim 10, wherein only pivotal movement of the beam associated with the slide limiter structure occurs when only one of the bistable input node elements is moved from its logic 0 state to its logic 1 state, the pivoting movement being insufficient to move the bistable output node element into its logic 1 state.

12. The circuit of claim 10, wherein movement of both of the bistable input node elements into their logic 1 states is required for the slide limiter structure to produce movement of the bistable output node element from its logic 0 state to its logic 1 state.

13. The circuit of claim 12, wherein the beam of the slide limiter structure translates in response to movement of both of the bistable input node elements from their logic 0 state to their logic 1 state, causing movement of the bistable output node element from its logic 0 state to its logic 1 state.

14. A resettable mechanical logic signal wire circuit formed as part of a material structure, the circuit comprising:
   first and second bistable elements each formed as a length of material of non-linear stiffness and supported at opposite ends thereof, each said bistable element having first and second orientations of low potential energy separated by a midpoint of high potential energy, each said bistable element being movable by an input signal applied to a center area of its length toward the midpoint of high potential energy;
   each said bistable element having a characteristic of being stable in either of its first and second orientations of low potential energy, once moved past the midpoint of high potential energy; and
   the first and second bistable elements arranged adjacent to one another and intercoupled by a biasing element at their center areas; and
   wherein movement of the first bistable element from a logic 0 state to a logic 1 state causes movement of the biasing element, which in turn causes the second bistable element to move from its logic 0 state to its logic one state.

15. The circuit of claim 14, further comprising a third bistable element arranged adjacent the second bistable element, and operatively coupled to the second bistable element by an additional biasing element; and
   wherein movement of the second bistable element into its logic 1 state causes the additional biasing element to urge the third bistable element from a logic 0 state to a logic 1 state.

16. A mechanical amplifier circuit formed within a material, the circuit comprising:
   first and second bistable elements each having a non-linear stiffness and forming bistable input and output node elements, respectively;
   each one of the bistable input and output node elements formed as a length of material and supported at opposite ends thereof, each said bistable input and output node element having first and second orientations of low potential energy separated by a midpoint of high potential energy, each said bistable input and output node element being movable by an input signal applied to a center area of its length toward the midpoint of high potential energy;
   each said bistable input and output node element having a characteristic of being stable in either of its first and second orientations of low potential energy, once moved past the midpoint of high potential energy; and
   the first and second bistable elements arranged adjacent to one another and intercoupled by an actuation shuttle, the actuation shuttle being supported by a plurality of lengths of material each including at least one energy responsive film;
   a power source operably associated with the bistable input node element and the actuation shuttle;
   a pivotally supported beam operatively coupled to the actuation shuttle and movable in accordance with linear movement of the actuation shuttle, the beam further being operatively coupled to the bistable output node element;
   wherein movement of the bistable input node element from its logic 0 state to its logic 1 state, along with electric power delivered to the energy responsive film and pivoting movement of the beam, controls a state of the bistable output node element.

17. The circuit of claim 16, wherein the actuation shuttle includes a pair of electrodes in communication with the plurality of lengths of material, and wherein movement of the bistable input node element selectively controls an application of electrical power to different ones of the lengths of material, to control movement of the bistable output node element.

18. The circuit of claim 16, wherein the energy responsive film comprises at least one of a piezoelectric material and a thermally responsive material.

19. A method for forming a resettable mechanical logic circuit as part of a material structure, the method comprising:
   forming a first bistable element as a length of material, and supported at least at one end thereof, to act as in input;
   further forming the first bistable element so that the first bistable element is movable between first and second orientations separated by a midpoint, the bistable element being movable by an input signal applied to a center area of its length toward the midpoint; and
   further forming the bistable element such that it is stable in either of its first and second orientations, once moved past the midpoint;
   using one orientation of the bistable element to indicate a logic 1 state and the other orientation of the bistable element to indicate a logic 0 state;
   using a second bistable element to act as an output; and
   using a third bistable element arranged non-parallel to the first and second bistable elements to act as a gate, wherein a position of the third bistable element controls whether the input signal applied to the first bistable element causes a change in state of the second bistable element.

20. A resettable mechanical logic circuit formed as part of a material structure, the circuit comprising:
   a first pair of the bistable elements, a first one of the first pair forming an input node flexure and a second one of the first pair forming an output node flexure;
   each one of the bistable elements having a characteristic of being stable in either one of first and second orientations, once moved past a midpoint orientation between the first and second orientations by an input signal;
   each of the input and output node flexures having a center material portion;
   each one of the input and output node flexures having a logic 1 state and a logic 0 state corresponding to two positions of low potential energy;
   rigid material lengths extending non-parallel to the bistable elements and forming linkages coupling each of the center material portions to a center node;
   a gate subsystem for applying the input signal to the center node, the gate subsystem having at least one movable component to controllably constrain movement of the center node; and
   wherein the gate subsystem controls, by application of the input signal to the center node, whether a change in state of the input node flexure from the logic 1 state to the logic 0 state causes a change in state of the output node flexure.

21. The circuit of claim 20, wherein the gate subsystem comprises:
   a second pair of bistable elements arranged perpendicularly to the first pair of bistable elements, the second pair of the bistable elements each forming a gate and each having a logic 1 state and a logic 0 state;
   center material portions arranged between each of the bistable elements of each one of the second pair of bistable elements;
   rigid material lengths forming linkages coupling the center material portions of each of the bistable elements of the second pair of bistable elements to the center node; and
   wherein orientations of the second pair of bistable elements control generation of the input signal to in turn control whether a change in state of the input node flexure from the logic 1 state to the logic 0 state causes a change in state of the output node flexure.

* * * * *